United States Patent
Shoeb et al.

(10) Patent No.: US 12,494,345 B2
(45) Date of Patent: Dec. 9, 2025

(54) PULSING RF COILS OF A PLASMA CHAMBER IN REVERSE SYNCHRONIZATION

(71) Applicant: Lam Research Corporation, Fremont, CA (US)

(72) Inventors: Juline Shoeb, Fremont, CA (US); Tom A. Kamp, San Jose, CA (US); Alexander Miller Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 243 days.

(21) Appl. No.: 18/015,708

(22) PCT Filed: Jul. 1, 2021

(86) PCT No.: PCT/US2021/040155
§ 371 (c)(1),
(2) Date: Jan. 11, 2023

(87) PCT Pub. No.: WO2022/015524
PCT Pub. Date: Jan. 20, 2022

(65) Prior Publication Data
US 2023/0282448 A1    Sep. 7, 2023

Related U.S. Application Data

(60) Provisional application No. 63/052,401, filed on Jul. 15, 2020.

(51) Int. Cl.
*H03H 7/38* (2006.01)
*H01J 37/32* (2006.01)

(52) U.S. Cl.
CPC .. *H01J 37/32146* (2013.01); *H01J 37/32183* (2013.01); *H03H 7/38* (2013.01); *H01J 2237/334* (2013.01)

(58) Field of Classification Search
CPC .... H01J 37/32; H01J 37/321; H01J 37/32146; H01J 37/32165; H01J 37/32183; H01J 37/32935; H01J 2237/334; H03H 7/38
See application file for complete search history.

(56) References Cited

U.S. PATENT DOCUMENTS

| | | | |
|---|---|---|---|
| 10,685,810 B2 | 6/2020 | Mopidevi et al. | |
| 2013/0106286 A1 | 5/2013 | Banna et al. | |

(Continued)

FOREIGN PATENT DOCUMENTS

| | | |
|---|---|---|
| CN | 103476196 A | 12/2013 |
| JP | 2000-260754 A | 9/2000 |
| JP | 2016-082180 A | 5/2016 |

OTHER PUBLICATIONS

ISR & WO PCT/US2021/040155, dated Oct. 21, 2021, 9 pages.

*Primary Examiner* — Thai Pham
(74) *Attorney, Agent, or Firm* — PENILLA IP, APC

(57) ABSTRACT

Systems and methods for pulsing radio frequency (RF) coils are described. One of the methods includes supplying a first RF signal to a first impedance matching circuit coupled to a first RF coil, supplying a second RF signal to a second impedance matching circuit coupled to a second RF coil, and pulsing the first RF signal between a first parameter level and a second parameter level. The method includes pulsing the second RF signal between a third parameter level and a fourth parameter level in reverse synchronization with the pulsing of the first RF signal.

20 Claims, 14 Drawing Sheets

(Two RF Coils)

(56) References Cited

U.S. PATENT DOCUMENTS

| | | |
|---|---|---|
| 2013/0256271 A1 | 10/2013 | Panagopoulos et al. |
| 2017/0103872 A1* | 4/2017 | Howald ............ H01J 37/32183 |
| 2017/0311431 A1 | 10/2017 | Park |
| 2020/0075290 A1* | 3/2020 | Kawasaki ......... H01J 37/32146 |
| 2021/0050185 A1* | 2/2021 | Martinez ........... H01J 37/32183 |
| 2023/0005718 A1* | 1/2023 | Shoeb ............... H01J 37/32146 |
| 2023/0223236 A1* | 7/2023 | Kamp ............... H01J 37/32174 |
| | | 156/345.28 |
| 2023/0274913 A1* | 8/2023 | Wu ................... H01J 37/32174 |
| | | 327/291 |

* cited by examiner (Two RF Coils)

(Lateral RF Coils)

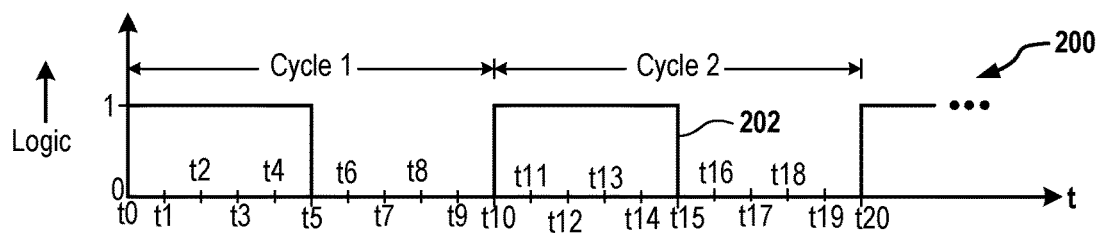
FIG. 2A
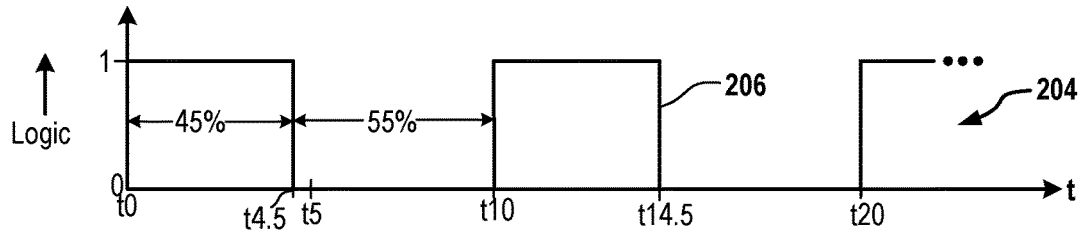
FIG. 2B (For RFG 102)
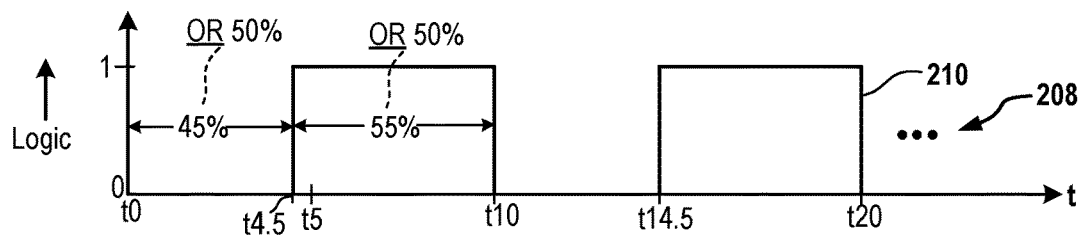
FIG. 2C (For RFG 104)
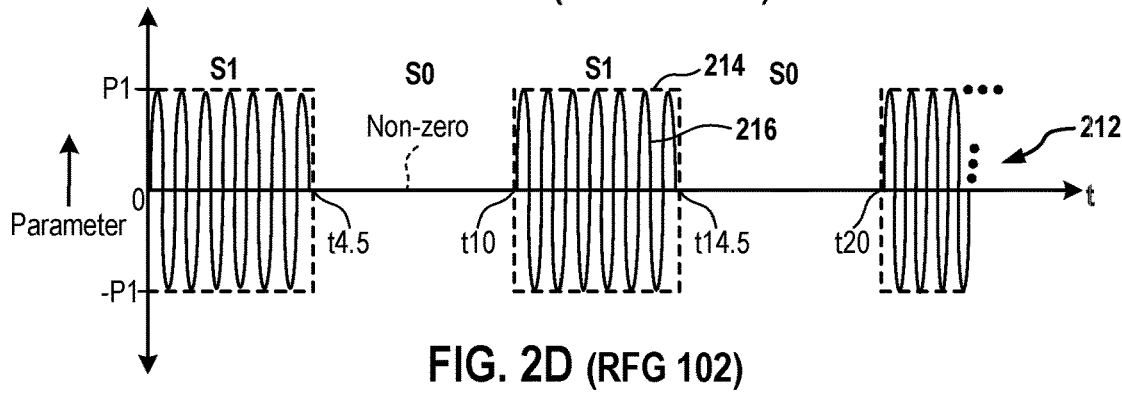
FIG. 2D (RFG 102)
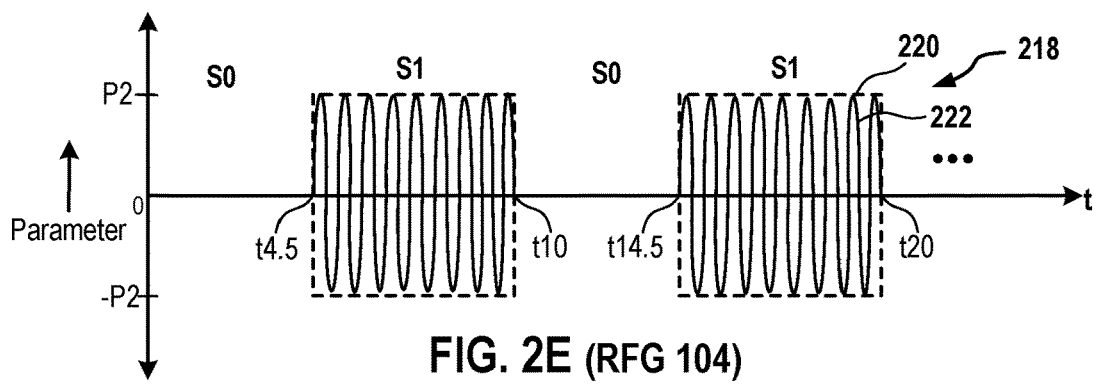
FIG. 2E (RFG 104)

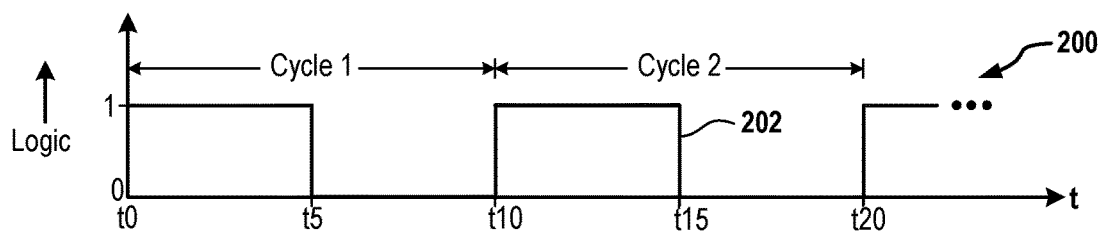
FIG. 3A
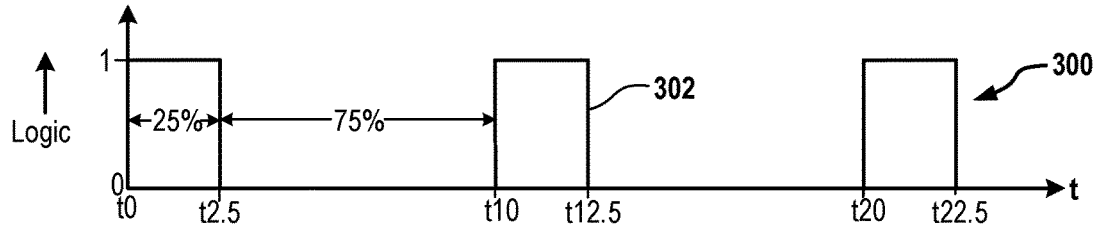
FIG. 3B (For RFG 102)
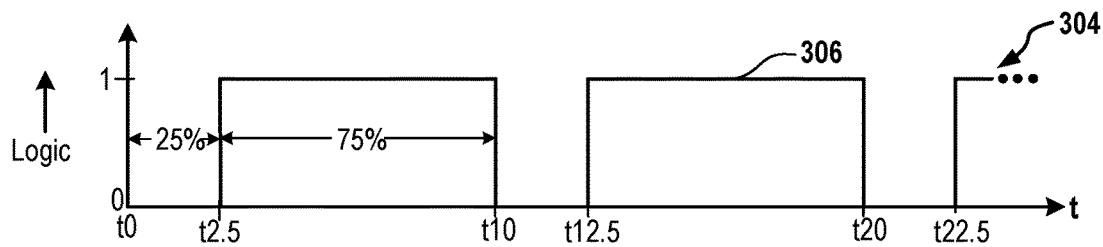
FIG. 3C (For RFG 104)
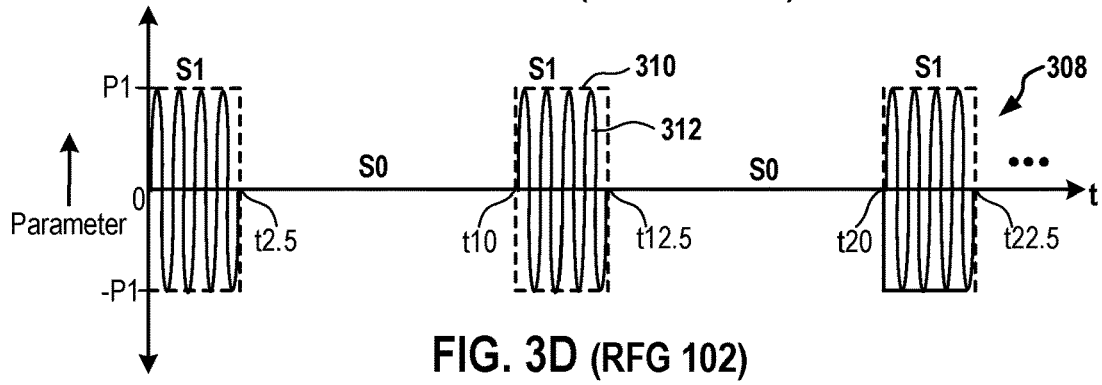
FIG. 3D (RFG 102)
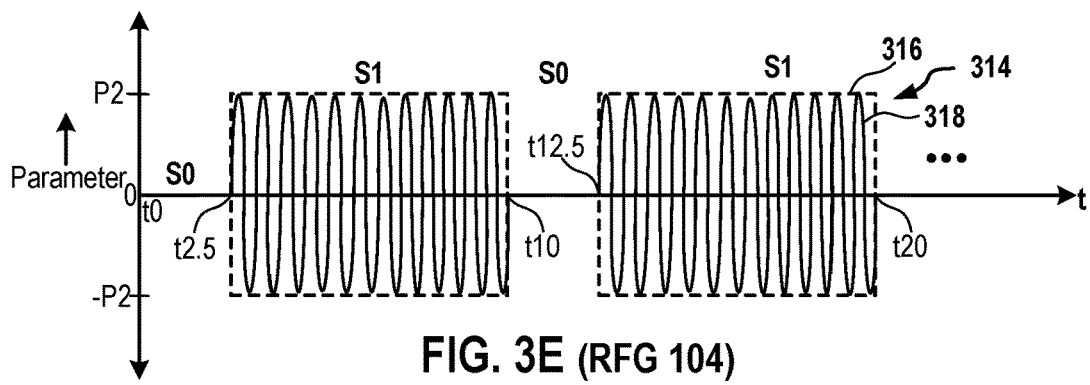
FIG. 3E (RFG 104)

FIG. 4B (For RFG 102)

FIG. 4C (For RFG 104)

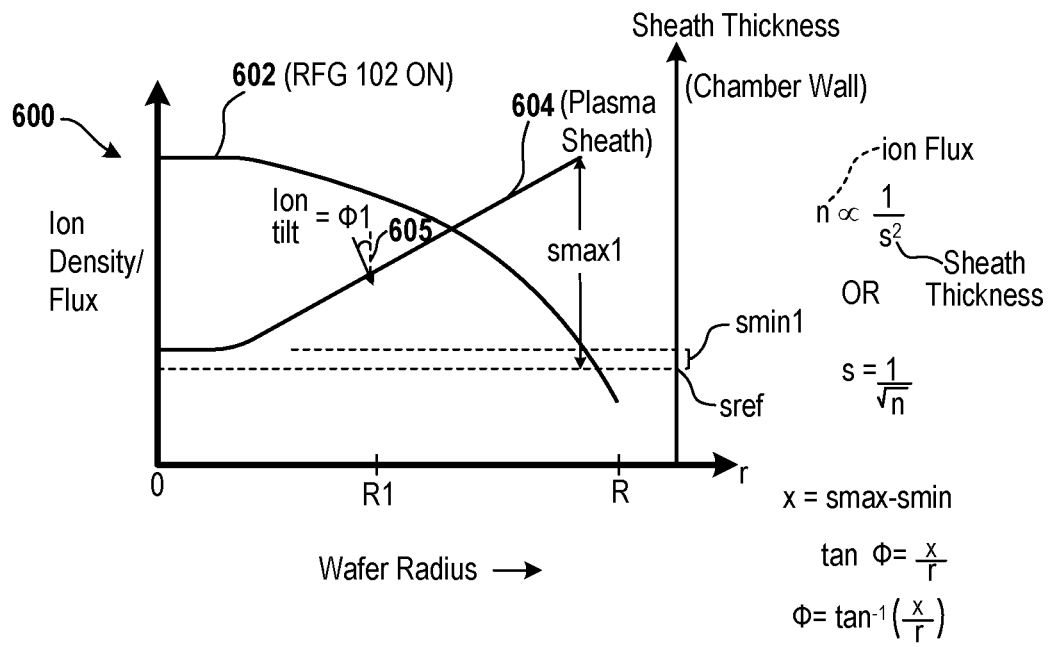
FIG. 6A (RFG 102 ON)
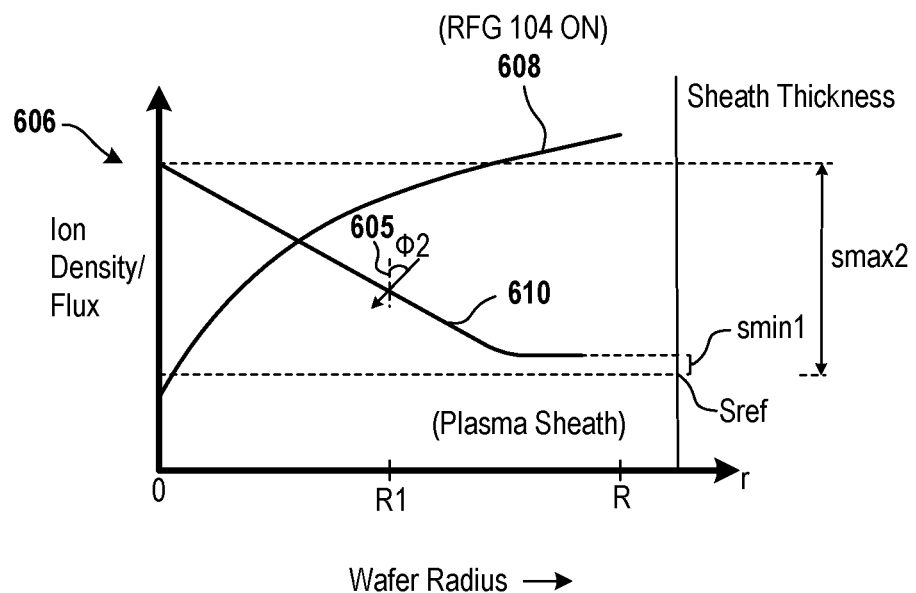
FIG. 6B (RFG 104 ON)

(Multiplex RFG 102 and RFG 104)

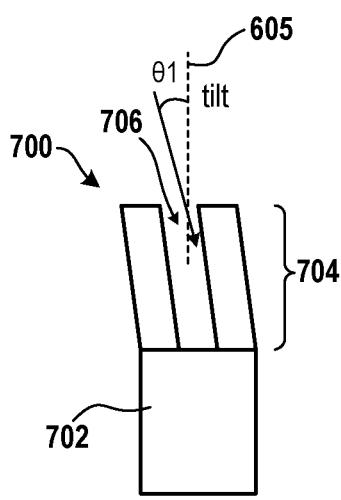
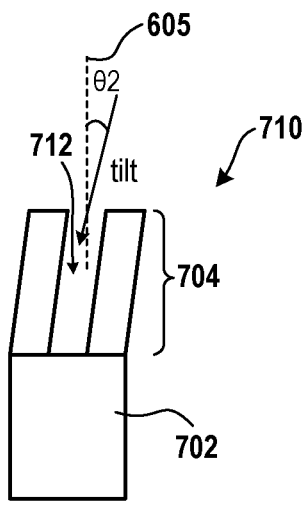
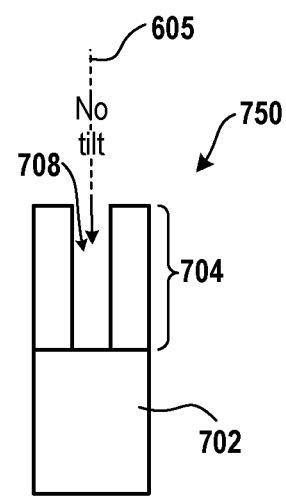
FIG. 7A
(RFGs ON Simultaneously)
FIG. 7B
(RFGs ON Simultaneously)
FIG. 7C
(Multiplex RFG 102 with RFG 104)
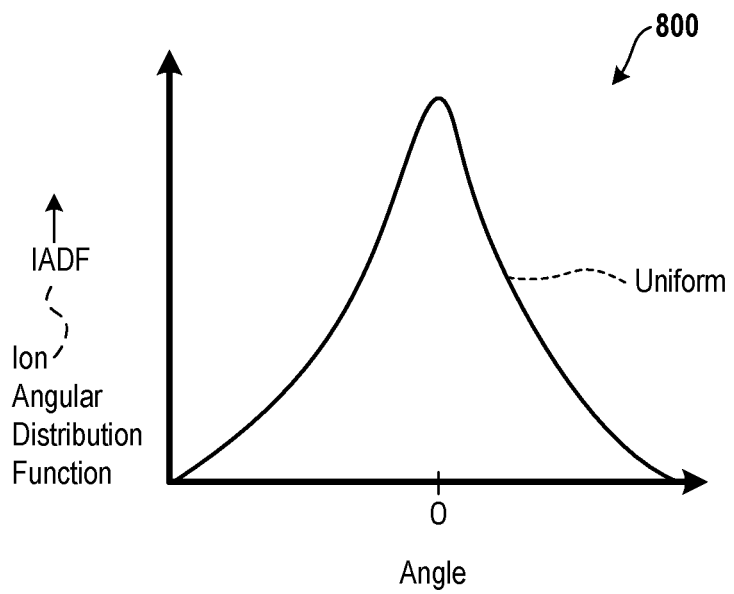
FIG. 8
(Multiplex RFG 102 with RFG 104)

(Three RF Coils)

(RFG 102)

(RFG 104)

(RFG 902)

PULSING RF COILS OF A PLASMA CHAMBER IN REVERSE SYNCHRONIZATION

CLAIM OF PRIORITY

This application is a national stage filing of and claims priority, under 35 U.S.C. § 371, to PCT/US21/40155, filed on Jul. 1, 2021, and titled "PULSING RF COILS OF A PLASMA CHAMBER IN REVERSE SYNCHRONIZATION", which claims the benefit of and priority, under 35 U.S.C. § 119 (e), to U.S. Provisional Patent Application No. 63/052,401, filed on Jul. 15, 2020, and titled "PULSING RF COILS OF A PLASMA CHAMBER IN REVERSE SYNCHRONIZATION", all of which are incorporated by reference herein in their entirety.

FIELD

The present embodiments relate to systems and methods for pulsing radio frequency (RF) coils of a plasma chamber in reverse synchronization.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes one or more radio frequency (RF) generators. The RF generators are coupled via one or more impedance matches to a plasma chamber. A substrate is placed within the plasma chamber.

The RF generators supply RF signals via the one or more impedance matches to the plasma chamber to process the substrate. However, the substrate is not processed in a uniform manner.

It is in this context that embodiments described in the present disclosure arise.

SUMMARY

Embodiments of the disclosure provide systems, apparatus, methods and computer programs for pulsing radio frequency (RF) coils of a plasma chamber in reverse synchronization. It should be appreciated that the present embodiments can be implemented in numerous ways, e.g., a process, an apparatus, a system, a device, or a method on a computer readable medium. Several embodiments are described below.

If density or flux of ions of plasma formed above a semiconductor wafer is nonuniform, a thickness of a sheath of the plasma is also nonuniform. Because the ions enter the sheath perpendicular to a boundary of the sheath, a tilted or non-uniform sheath results in tilted ion directions. Such tilting of the ion directions is not desired as the tilting may result in tilted etch profile. To minimize the tilting, the systems and methods, described herein, generate plasma that has a uniform plasma sheath.

In one embodiment, the systems include separately pulsed radio frequency (RF) coils. When a first one of the two RF coils is on during a pulsing cycle, a second one of the two RF coils is switched off during the pulsing time period. This reverse synchronization reduces interferences between the first and second RF coils and uniformity of both plasma density and sheath thickness improve.

In an embodiment, the systems include separately pulsed RF coil sets. When a first one of the two RF coil sets is on during a pulsing time period, a second one of the two RF coil sets is switched off during the pulsing time period. Each RF coil set includes two or more RF coils. This reverse synchronization reduces interferences between the first and second RF coil sets and uniformity of the plasma sheath thickness increases.

In an embodiment, when the first RF coil is turned on during a portion of the pulsing cycle, the first RF coil increases density of plasma in a first region below the first RF coil to further increase uniformity of the plasma in the first region. Also, when the second RF coil is turned off, density of plasma in a second region below the second RF coil decreases to further decreases uniformity of the plasma in the second region. On the other hand, when the second RF coil is turned on and the first RF coil is turned off during the remaining portion of the pulsing cycle, the second region starts to gain plasma and becomes more uniform. Also, the first region becomes reasonably uniform because plasma density from the second region diffuses and travels to plasma in the first region. Again, when the first RF coil is turned on, uniformity of plasma in the first region increases and plasma from the first region travels to the second region to achieve uniformity in the second region. In this manner, by time divisional multiplexing the first and second RF coils, time averaged density or flux uniformity of plasma ions and electrons increase to produce uniform plasma sheath thickness and plasma ions entering a plasma sheath of the uniform plasma have very minimal or no tilt.

In one embodiment, a method for pulsing RF coils is described. The method includes supplying a first RF signal to a first impedance matching circuit coupled to a first RF coil, supplying a second RF signal to a second impedance matching circuit coupled to a second RF coil, and pulsing the first RF signal between a first parameter level and a second parameter level. The method includes pulsing the second RF signal between a third parameter level and a fourth parameter level in reverse synchronization with the pulsing of the first RF signal.

In one embodiment, a method for reverse pulsing of RF coils is described. The method includes receiving an indication of multiplexing operation of a first RF generator and a second RF generator. The first RF generator is coupled to a first RF coil and the second RF generator is coupled to a second RF coil. The method further includes receiving a selection indicating that the first RF generator is to start operating in a state, receiving a duty cycle of operation of the first RF generator, and controlling the first RF generator to have the duty cycle and to start operating in the state. The method includes controlling the second RF generator to operate in reverse synchronization with the first RF generator. The operation of the first RF generator and the second RF generator in reverse synchronization with each other causes the first RF generator to generate a first RF signal and the second RF generator to generate a second RF signal. The second RF signal pulses in reverse synchronization with the first RF signal.

In an embodiment, a system for pulsing RF coils is described. The system includes a first RF generator configured to supply a first RF signal to a first impedance matching circuit that is coupled to a first RF coil of a plasma chamber. The system further includes a second RF generator configured to supply a second RF signal to a second impedance matching circuit that is coupled to a second RF coil of the plasma chamber. The first RF generator pulses the first RF signal between a first parameter level and a second parameter level. The second RF generator pulses the second RF signal between a third parameter level and a fourth parameter level in reverse synchronization with the first RF signal.

In an embodiment, to pulse the second RF signal in reverse synchronization with the first RF signal, the second RF generator transitions the second RF signal from the third parameter level to the fourth parameter level during a time period in which the first RF signal transitions from the first parameter level to the second parameter level. Also to pulse the second RF signal in reverse synchronization with the first RF signal, the second RF generator transitions the second RF signal from the fourth parameter level to the third parameter level during a time period in which the first RF signal transitions from the second parameter level to the first parameter level.

In one embodiment, the second RF generator maintains the second RF signal at the third parameter level during a time period in which the first RF generator maintains the first RF signal at the first parameter level. Moreover, the second RF generator maintains the second RF signal at the fourth parameter level during a time period in which the first RF generator maintains the first RF signal at the second parameter level.

In an embodiment, each of the first RF generator and the second RF generator receives a synchronization signal. The first parameter level and the second parameter level occur during a cycle of the synchronization signal, and the third parameter level and the fourth parameter level occur during the cycle.

In one embodiment, to pulse the first RF signal, the first RF generator transitions the first RF signal from the first parameter level to the second parameter level during a cycle of a synchronization signal. Also, to pulse the RF signal, the first RF generator transitions the first RF signal from the second parameter level to the first parameter level during the cycle of the synchronization signal. Further, to pulse the second RF signal, the second RF generator transitions the second RF signal from the third parameter level to the fourth parameter level during the cycle of the synchronization signal. Also, to pulse the second RF signal, the second RF generator transitions the second RF signal from the fourth parameter level to the third parameter level during the cycle of the synchronization signal.

In an embodiment, the system includes a third RF generator that supplies a third RF signal to a third RF coil of the plasma chamber via a third impedance matching circuit. The third RF generator pulses the third RF signal between a fifth parameter level and a sixth parameter level. The third RF signal is pulsed in reverse synchronization with the first RF signal and the second RF signal.

In an embodiment, a controller is described. The controller includes a processor that controls a first RF generator to supply a first RF signal to a first impedance matching circuit that is coupled to a first RF coil of a plasma chamber. The processor also controls a second RF generator to supply a second RF signal to a second impedance matching circuit that is coupled to a second RF coil of the plasma chamber. The processor further controls the first RF generator to pulse the first RF signal between a first parameter level and a second parameter level. The processor controls the second RF generator to pulse the second RF signal between a third parameter level and a fourth parameter level in reverse synchronization with the first RF signal. The controller includes a memory device coupled to the processor for storing the first, second, third, and fourth parameter levels.

In an embodiment, to pulse the second RF signal in reverse synchronization with the first RF signal, the processor controls the second RF generator to transition the second RF signal from the third parameter level to the fourth parameter level. The second RF signal transitions from the third parameter level to the fourth parameter level during a time period in which the first RF signal transitions from the first parameter level to the second parameter level. Also, to pulse the second RF signal in reverse synchronization with the first RF signal, the processor controls the second RF generator to transition the second RF signal from the fourth parameter level to the third parameter level. The second RF signal transitions from the fourth parameter level to the third parameter level during a time period in which the first RF signal transitions from the second parameter level to the first parameter level.

In an embodiment, a controller is described. The controller includes a processor that receives a selection indicating whether a first RF generator is to be pulsed in reverse synchronization with a second RF generator. The first RF generator is coupled to a first impedance matching circuit that is coupled to a first RF coil of a plasma chamber. The second RF generator is coupled to a second impedance matching circuit that is coupled to a second RF coil of the plasma chamber. The controller includes a memory device coupled to the processor.

In one embodiment, the processor receives a selection indicating whether the first RF generator or the second RF generator is to initiate operation at a first state. In response to receiving the selection indicating that the first RF generator is to initiation operation at the first state, the processor controls the second RF generator to initiate operation at a second state.

Some advantages of the herein described systems and methods include increasing uniformity in processing a semiconductor wafer and reducing tilt of ions to be minimal or zero. The methods include pulsing the two RF coils in a reversely synchronized manner. When the first RF coil has a high state and the second RF coil has a low state, there is an increase in sheath thickness towards a central region above the semiconductor wafer and a decrease in sheath thickness towards an edge region above the semiconductor wafer. Ion tilt of ions entering the sheath increases towards the central region and decreases towards the edge region. On the other hand, when the first RF coil has a low state and the second RF coil has a high state, there is an increase in sheath thickness towards the edge region of the semiconductor wafer and decrease in sheath thickness towards the central region of the substrate. Ion tilt of ions entering the sheath increases towards the edge region and decreases towards the central region. When the RF coils are pulsed in the reversely synchronized manner for a period of time, multiple cycles of reverse pulsing occur. Over the period of time, the plasma sheath becomes more uniform across the central and edge regions above the semiconductor wafer. Also, because the plasma sheath becomes more uniform, the ion tilt decreases to be minimal to process the semiconductor wafer in a uniform manner across a top surface of the semiconductor wafer.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2A is an embodiment of a graph to illustrate a synchronization signal.

FIG. 2B is an embodiment of a graph to illustrate a digital pulsed signal for illustrating a duty cycle of a parameter of an RF signal generated by an RF generator.

FIG. 2C is an embodiment of a graph to illustrate a digital pulsed signal for illustrating a duty cycle of a parameter of an RF signal generated by an RF generator.

FIG. 2D is an embodiment of a graph to illustrate a parameter of an RF signal.

FIG. 2E is an embodiment of a graph to illustrate a parameter of an RF signal.

FIG. 3A is an embodiment of the graph of FIG. 2A to illustrate the synchronization signal.

FIG. 3B is an embodiment of a graph to illustrate a digital pulsed signal for illustrating a duty cycle of a parameter of an RF signal generated by an RF generator.

FIG. 3C is an embodiment of a graph to illustrate a digital pulsed signal for illustrating a duty cycle of a parameter of an RF signal generated by an RF generator.

FIG. 3D is an embodiment of a graph to illustrate a parameter of an RF signal.

FIG. 3E is an embodiment of a graph to illustrate a parameter of an RF signal.

FIG. 4B is an embodiment of a graph to illustrate a digital pulsed signal for illustrating a duty cycle of a parameter of an RF signal generated by an RF generator.

FIG. 4C is an embodiment of a graph to illustrate a digital pulsed signal for illustrating a duty cycle of a parameter of an RF signal generated by an RF generator.

FIG. 6A is an embodiment of a graph to illustrate a plot of flux of ions of plasma within a plasma chamber versus a radius of a substrate placed within the plasma chamber.

FIG. 6B is an embodiment of a graph to illustrate a plot of the flux of ions of plasma within the plasma chamber versus the radius of the substrate placed within the plasma chamber.

FIG. 7A is a diagram of an embodiment to illustrate a substrate that is etched when multiple RF generators have the same state during the same time period.

FIG. 7B is a diagram of an embodiment to illustrate a substrate that is etched when multiple RF generators have the same state during the same time period.

FIG. 7C is a diagram of an embodiment of a substrate that is etched when multiple RF generators are pulsed in reverse synchronization with each other.

FIG. 8 is an embodiment of a graph to illustrate an ion angular distribution function.

DETAILED DESCRIPTION

The following embodiments describe systems and methods for pulsing radio frequency (RF) coils of a plasma chamber in reverse synchronization. It will be apparent that the present embodiments may be practiced without some or all of these specific details. In other instances, well known process operations have not been described in detail in order not to unnecessarily obscure the present embodiments.

Figure 1A:
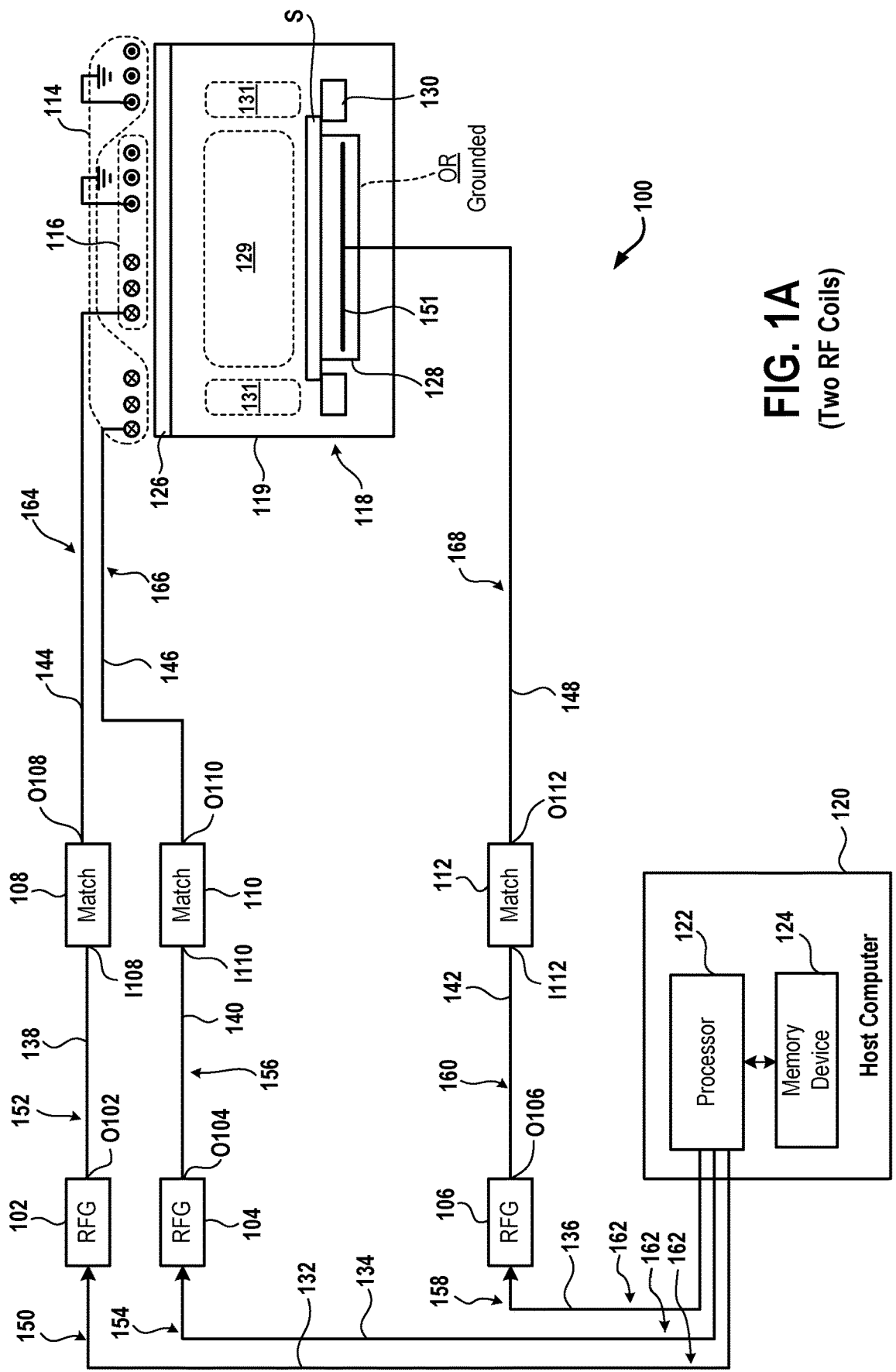
FIG. 1A is a diagram of an embodiment of a system to illustrate reverse pulsing of a first radio frequency (RF) coil and a second RF coil.

FIG. 1A is a diagram of an embodiment of a system 100 to illustrate reverse pulsing of an RF coil 114 and an RF coil 116. The system 100 includes an RF generator 102, an RF generator 104, a match 108, a match 110, a plasma chamber 118, an RF generator 106, a match 112, and a host computer 120. An example of the plasma chamber 118 is a transformer coupled plasma (TCP) chamber or an inductively coupled plasma (ICP) plasma chamber.

It should be noted that the terms match, impedance match, impedance matching circuit, and impedance matching network are used herein interchangeably. It should further be noted that the terms RF coil or TCP coil or ICP coil are used herein interchangeably.

The host computer 120 includes a processor 122 and a memory device 124. Examples of a host computer include a desktop, a laptop, a tablet, and a smartphone. As used herein, a processor is an application specific integrated circuit (ASIC), or a programmable logic device (PLD), or a central processing unit (CPU), or a microprocessor, or a microcontroller. Examples of a memory device include a random access memory (RAM) and a read-only memory (ROM). To illustrate, a memory device is a flash memory, a hard disk, or a storage device, etc. A memory device is an example of a computer-readable medium.

Each RF generator 102, 104, and 106 has a frequency of operation. For example, each RF generator 102 and 104 has a frequency of operation that ranges from 10 kilohertz (kHz) to 100 kHz. As an example, the RF generator 106 has a frequency of operation that ranges from 10 kHz to 100 kHz. As another example, the RF generator 106 has a frequency of operation of 400 kHz or 2 megahertz (MHz) or 13.56 MHz or 27 MHz or 60 MHZ.

In one embodiment, the RF generator 104 operates at substantially the same frequency as the RF generator 102. For example, a frequency of operation of the RF generator 104 is within a predetermined range, such as within +10%, from a frequency of operation of the RF generator 102. As another example, both the RF generators 102 and 104 have the same frequency of operation.

A match, as described herein, includes a network of one or more resistors, or one or more capacitors, or one or more inductors, or a combination thereof. For example, a match includes multiple series circuits and multiple shunt circuits that are coupled with each other. Each series circuit includes a resistor, or a capacitor, or an inductor, or a combination thereof. Similarly, each shunt circuit includes a resistor, or a capacitor, or an inductor, or a combination thereof. Each shunt circuit is coupled to a series circuit at one end and to a ground potential at an opposite end. An example of a ground potential is a zero potential. Ends of each series circuit are not coupled to the ground potential. For example, a first end of a series circuit is coupled to an input of the match and a second end of the series circuit is coupled to a shunt circuit and to an output of the match.

The plasma chamber 118 includes a dielectric window 126 and a chamber wall, which is a side wall 119. The dielectric window 126 is placed on top of the side wall 119 of the plasma chamber 118. The dielectric window 126 forms a top wall of the plasma chamber 118. The RF coils 114 and 116 are located above the dielectric window 126. The plasma chamber 118 further includes a substrate support 128 and an edge ring 130. An example of the substrate support 128 is a chuck, such as an electrostatic chuck (ESC). The substrate support 128 has a lower electrode 158 embedded within the substrate support 128. The edge ring 130 surrounds a periphery of the substrate support 128. As an example, the edge ring 130 is fabricated from a conductive material, such as silicon, boron doped single crystalline silicon, alumina, silicon carbide, or silicon carbide layer on top of alumina layer, or an alloy of silicon, or a combination thereof. It should be noted that the edge ring 130 has an annular body, such as a ring-shaped body or a dish-shaped body.

The RF coil 114 is an outer coil and the RF coil 116 is an inner coil. For example, the RF coil 114 is placed above the edge ring 130 and the inner RF coil 116 is placed above the substrate support 128, and there is no overlap between the RF coils 114 and 116. Also, no portion of the RF coil 114 lies above the substrate support 128 and no portion of the RF coil 116 lies above the edge ring 130. The RF coil 114 has a larger diameter than a diameter of the RF coil 116. For example, the RF coil 114 is located next to an outer periphery of the RF coil 116. Both the RF coils 114 and 116 are located in the same horizontal plane.

The processor 122 is coupled via a transfer cable 132 to the RF generator 102. Similarly, the processor 122 is coupled via a transfer cable 134 to the RF generator 104 and is coupled via a transfer cable 136 to the RF generator 106. Examples of a transfer cable, as used herein, include a coaxial cable that is used to transfer data in a parallel manner, a cable that is used to transfer data in a serial manner, and a Universal Serial Bus (USB) cable. The processor 122 is also coupled to the memory device 124.

An output O102 of the RF generator 102 is coupled via an RF cable 138 to an input 1108 of the match 108, and an output O108 of the match 108 is coupled via an RF transmission line 144 to a first end end of the RF coil 116. A second end of the RF coil 116 is coupled to a ground connection. Similarly, an output O104 of the RF generator 104 is coupled via an RF cable 140 to an input 1110 of the match 110, and an output O110 of the match 110 is coupled via an RF transmission line 146 to a first end of the TCP coil 114. A second end of the TCP coil 114 is coupled to a ground connection. Also, an output O106 of the RF generator 106 is coupled via an RF cable 142 to an input 1112 of the match 112, and an output O112 of the match 112 is coupled via an RF transmission line 148 to the lower electrode 151 of the substrate support 128.

As an example, an RF transmission line, such as the RF transmission line 144 or 146 or 148, includes an RF cable that is coupled to an RF rod of an RF cylinder. The RF cable is surrounded by an insulator material, which is surrounded by an RF sheath. The RF rod of the RF cylinder is surrounded by the RF cylinder. An RF strap couples the RF cable to the RF rod of the RF cylinder. As another example, an RF transmission line, such as the RF transmission line 144 or 146 or 148, includes an RF cable. The RF cable is surrounded by an insulator material, which is surrounded by an RF sheath. There is no use of an RF cylinder in the RF transmission line.

The processor 122 generates a recipe signal 150. The recipe signal 150 includes recipe information, such as a parameter of an RF signal 152 to be generated by the RF generator 102 and a frequency of the RF signal 152. As used herein, a parameter of an RF signal is voltage or power of the RF signal. The recipe information of the recipe signal 150 further includes a duty cycle of the parameter of the RF signal 152. The processor 122 sends the recipe signal 150 via the transfer cable 132 to the RF generator 102. Upon receiving the recipe signal 150, the RF generator 102 stores the recipe information of the recipe signal 150 in one or more memory devices of the RF generator 102.

Similarly, the processor 122 generates a recipe signal 154. The recipe signal 154 includes recipe information, such as a parameter of an RF signal 156 to be generated by the RF generator 104 and a frequency of the RF signal 156. The recipe information of the recipe signal 154 further includes a duty cycle of the parameter of the RF signal 156. The processor 122 sends the recipe signal 154 via the transfer cable 134 to the RF generator 104. Upon receiving the recipe signal 154, the RF generator 104 stores the recipe information of the recipe signal 154 in one or more memory devices of the RF generator 104.

Also, the processor 122 generates a recipe signal 158. The recipe signal 158 includes recipe information, such as a parameter of an RF signal 160 to be generated by the RF generator 106 and a frequency of the RF signal 160. The recipe information of the recipe signal 158 further includes a duty cycle of the parameter of the RF signal 160. As an example, the duty cycle of the parameter of the RF signal 160 is 100%, in which case, the RF signal 160 is a continuous wave RF signal. The continuous wave RF signal has a single parameter level and does not transition from a first parameter level to a second parameter level. The continuous wave RF signal has a single parameter level during each cycle of a synchronization signal 162. As another example, the duty cycle of the parameter of the RF signal 160 is 50%, in which case, the RF signal 160 is pulsed between two states. To illustrate, the RF signal 160 transitions from a first parameter level to the second parameter level and transitions from the second parameter level to the first parameter level during each cycle of the synchronization signal 162. The processor 122 sends the recipe signal 158 via the transfer cable 136 to the RF generator 106. Upon receiving the recipe signal 158, the RF generator 106 stores the recipe information of the recipe signal 158 in one or more memory devices of the RF generator 106.

Also, the processor 122 generates the synchronization signal 162. The processor 122 sends the synchronization signal 162 via the transfer cable 132 to the RF generator 102, sends the synchronization signal 162 via the transfer cable 134 to the RF generator 104, and sends the synchronization signal 162 via the transfer cable 136 to the RF generator 106.

Upon receiving the synchronization signal 162, the RF generator 102 generates the RF signal 152 having the parameter and frequency received within the recipe signal 150. The frequency of the RF signal 152 is the same as the frequency of operation of the RF generator 102. The RF generator 102 sends the RF signal 152 via the output O102 and the RF cable 138 to the input I108 of the match 108.

The match 108 matches an impedance of a load coupled to the output O108 with an impedance of a source coupled to the input I108 to modify an impedance of the RF signal 152 to provide a modified RF signal 164 at the output O108. An example of the load coupled to the output O108 includes the RF transmission line 144 and the plasma chamber 118. An example of the source coupled to the input I108 includes the RF generator 102 and the RF cable 138. The modified RF signal 164 is supplied from the output O108 via the RF transmission line 144 to the RF coil 116. When the modified RF signal 164 is supplied to the RF coil 116, inductive power from the RF coil 116 is supplied to a central region 129 formed by a gap between the substrate support 128 and the dielectric window 126 to process a central region of a substrate S, such as a semiconductor wafer.

In a similar manner, in response to receiving the synchronization signal 162, the RF generator 104 generates the RF signal 156 having the parameter and frequency received within the recipe signal 154. The frequency of the RF signal 156 is the same as the frequency of operation of the RF generator 104. The RF generator 104 sends the RF signal 156 via the output O104 and the RF cable 140 to the input I110 of the match 110.

The match 110 matches an impedance of a load coupled to the output O110 with an impedance of a source coupled to the input I110 to modify an impedance of the RF signal 156 to provide a modified RF signal 166 at the output O110. An example of the load coupled to the output O110 includes the RF transmission line 146 and the plasma chamber 118. An example of the source coupled to the input I110 includes the RF generator 104 and the RF cable 140. The modified RF signal 166 is supplied from the output O110 via the RF transmission line 146 to the RF coil 114. When the modified RF signal 166 is supplied to the RF coil 114, inductive power is supplied from the RF coil 114 to an edge region 131 formed by a gap between the edge ring 130 and the dielectric window 126 to process an edge region of the substrate S.

The edge region 131 is peripheral to the central region 129. Also, the edge region of the substrate S is peripheral to the central region of the substrate S.

Also, upon receiving the synchronization signal 162, the RF generator 106 generates the RF signal 160 having the parameter and frequency received within the recipe signal 158. The frequency of the RF signal 160 is the same as the frequency of operation of the RF generator 106. The RF generator 106 sends the RF signal 160 via the output O106 and the RF cable 142 to the input I112 of the match 112.

The match 112 matches an impedance of a load coupled to the output O112 with an impedance of a source coupled to the input I112 to modify an impedance of the RF signal 160 to provide a modified RF signal 168 at the output O112. An example of the load coupled to the output O112 includes the RF transmission line 148 and the plasma chamber 118. An example of the source coupled to the input I112 includes the RF cable 142 and the RF generator 106. The modified RF signal 168 is supplied from the output O112 via the RF transmission line 148 to the lower electrode 151.

When one or more process gases are supplied to the plasma chamber 118 in addition to supplying the modified RF signals 164, 166, and 168, plasma is stricken or maintained within the plasma chamber 118 to process the substrate S, which is placed on a top surface of the substrate support 128. Examples of the one or more process gases include an oxygen-containing gas, such as $O_2$. Other examples of the one or more process gases include a chlorine-containing gas and a fluorine-containing gas, e.g., tetrafluoromethane ($CF_4$), sulfur hexafluoride ($SF_6$), hexafluoroethane ($C_2F_6$), etc. Examples of processing the substrate S include depositing a material on the substrate S, etching the substrate S, cleaning the substrate S, and sputtering the substrate S.

In one embodiment, any of the RF generators 102, 104, and 106 has a different frequency of operation than that illustrated with respect to FIG. 1A. For example, the RF generator 102 has a frequency of operation of 400 kHz or 2 MHz or 13.56 MHz or 27 MHz or 60 MHz. As an example, the RF generator 104 has a frequency of operation of 400 kHz or 2 MHz or 13.56 MHz or 27 MHz or 60 MHz.

In an embodiment, the RF coil 114 is located in a horizontal plane that is above or below a horizontal plane in which the RF coil 116 is located.

In one embodiment, lower electrode 151 of the substrate support 128 is coupled to a ground potential instead of being coupled to the RF generator 106 via the match 112.

In an embodiment, a dielectric ring is placed between the edge ring 130 and the substrate support 128.

Figure 1B:
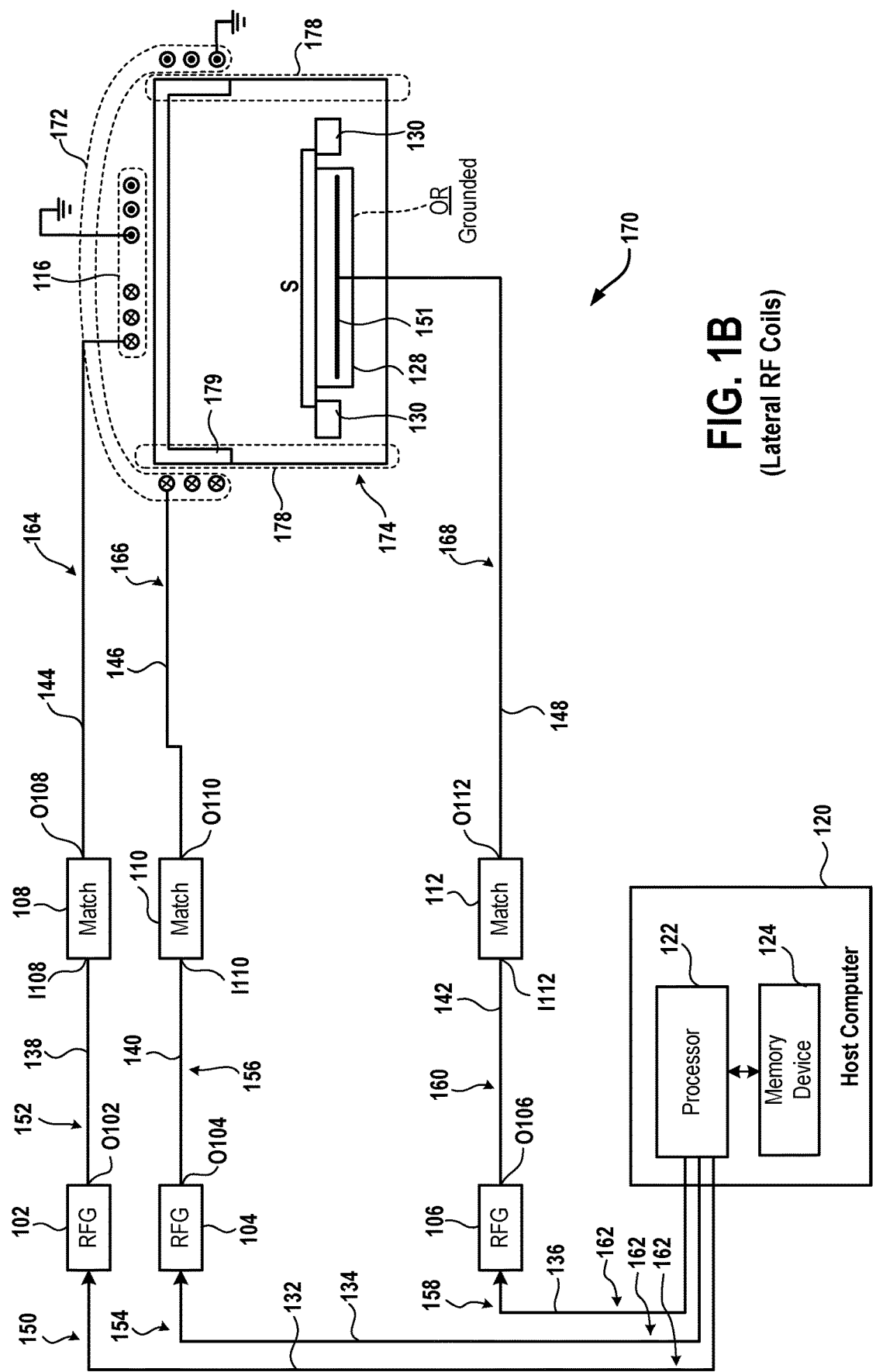
FIG. 1B is a diagram of an embodiment of a system to illustrate a lateral RF coil for reverse pulsing.

FIG. 1B is a diagram of an embodiment of a system 170 to illustrate a lateral RF coil 172. The system 170 is similar in structure and function as that of the system 100 of FIG. 1A except that the system 170 includes a plasma chamber 174 having the lateral RF coil 172. The plasma chamber 174 further includes a dielectric window 176 that replaces a portion of a side wall 178 of the plasma chamber 174. For example, the dielectric window 176 forms a top wall of the plasma chamber 174 and forms a top portion of the side wall 178 of the plasma chamber 174. The dielectric window 176 is placed on top of the remaining portion of the side wall 178 of the plasma chamber 174.

The lateral RF coil 172 is placed on a side of the portion of the sidewall 178 that is formed by the dielectric window 176. For example, the lateral RF coil 172 lies in the same horizontal place in which the portion of the sidewall 178 that is formed by the dielectric window 176 lies.

The output O110 of the match 110 is coupled via the RF transmission line 146 to one end of the lateral RF coil 172. An opposite end of the lateral RF coil 172 is coupled to a ground potential.

FIG. 2A is an embodiment of a graph 200 to illustrate a synchronization signal 202. The graph 200 plots a logic level of the synchronization signal 202 versus time t. The synchronization signal 202 is an example of the synchronization signal 162 (FIGS. 1A and 1B). An example of the synchronization signal 202 is a clock signal. Another example of the synchronization signal 202 is a digital pulsed signal having a duty cycle. The logic level of the synchronization signal 202 is plotted on a y-axis and the time t is plotted on an x-axis. As an example, a logic level is a voltage level. For example, a logic level 1 corresponds to a voltage level of 5 volts (V) and a logic level 0 corresponds to a voltage of 0 volts.

The x-axis of the graph 200 is divided into equal time segments or time periods or time intervals. For example, the x-axis of the graph 200 is divided into a first time interval between a time t0 and time t1, a second time interval between the time t1 and a time t2, and so on until a twentieth time interval between a time t19 and a time 20.

The synchronization signal 202 has multiple consecutive cycles, such as a cycle 1 and the cycle 2. The cycle 2 is consecutive to the cycle 1. The cycle 1 of the synchronization signal 202 occurs from the time t0 to a time t10 and the cycle 2 of the synchronization signal 202 occurs from the time t10 to the time t20.

The synchronization signal 202 pulses, such as transitions, from the logic level 0 to the logic level 1 at the time to and remains at the logic level 1 from the time t0 to the time t5. Also, the synchronization signal 202 transitions from the logic level 1 to the logic level 0 at the time t5 and remains at the logic level 0 from the time t5 to the time t10. Moreover, the synchronization signal 202 pulses from the logic level 0 to the logic level 1 at the time t10 and remains at the logic level 1 from the time t10 to the time t15. The synchronization signal 202 transitions from the logic level 1 to the logic level 0 at the time t15 and remains at the logic level 0 from the time t15 to the time t20.

In one embodiment, the synchronization signal 202 has a duty cycle different than a 50% duty cycle illustrated in FIG. 2A. For example, the synchronization signal 202 has a duty cycle of 10% or 20% or 30% or 60%.

FIG. 2B is an embodiment of a graph 204 to illustrate a digital pulsed signal 206 for illustrating a duty cycle of the parameter of the RF signal 152 generated by the RF generator 102. The graph 204 plots a logic level of the digital pulsed signal 206 versus the time t. The logic level of the digital pulsed signal 206 is plotted on a y-axis and the time t is plotted on an x-axis.

The digital pulsed signal 206 has a duty cycle of 45%. For example, during the cycle 1 of the synchronization signal 202, the digital pulsed signal 206 transitions at the time t0 from the logic level 0 to the logic level 1 and remains at the logic level 1 from the time t0 to a time t4.5, which lies at half of a time period between the times t4 and t5. Also, during the cycle 1 of the synchronization signal 202, the digital pulsed signal 206 transitions from the logic level 1 to the logic level 0 at the time t4.5 and stays at the logic level 0 from the time t4.5 to the time t10. Moreover, during the cycle 2 of the synchronization signal 202, the digital pulsed signal 206 transitions at the time t10 from the logic level 0 to the logic level 1 and remains at the logic level 1 from the time t10 to a time t14.5, which lies at half of a time period between the times t14 and t15. During the cycle 2 of the synchronization signal 202, the digital pulsed signal 206 transitions from the logic level 1 to the logic level 0 at the time t14.5 and stays at the logic level 0 from the time t14.5 to the time t20. As such, during each cycle of the synchronization signal 202, the digital pulsed signal 206 has the logic level 1 for a time period that occupies 45% of the cycle and has the logic level 0 for a remaining time period that occupies 55% of the cycle. The duty cycle of the parameter of the RF signal 152 is provided within the recipe signal 150 that is sent from the processor 122 (FIGS. 1A and 1B) to the RF generator 102 (FIGS. 1A and 1B) via the transfer cable 132.

In one embodiment, instead of a 45% duty cycle, the digital pulsed signal 206 has a duty cycle that is greater than or less than 45%. For example, the digital pulsed signal 206 has a duty cycle of 35% or 55% or 65%.

FIG. 2C is an embodiment of a graph 208 to illustrate a digital pulsed signal 210 for illustrating a duty cycle of the parameter of the RF signal 156 generated by the RF generator 104. The graph 208 plots a logic level of the digital pulsed signal 210 versus the time t. The logic level of the digital pulsed signal 210 is plotted on a y-axis and the time t is plotted on an x-axis.

The digital pulsed signal 210 has a duty cycle of 55% and is reversely synchronized with respect to the digital pulsed signal 206 (FIG. 2B). For example, during the cycle 1 of the synchronization signal 202, the digital pulsed signal 210 transitions at the time to from the logic level 1 to the logic level 0 and remains at the logic level 0 from the time t0 to the time t4.5. Also, during the cycle 1 of the synchronization signal 202, the digital pulsed signal 210 transitions from the logic level 0 to the logic level 1 at the time t4.5 and stays at the logic level 1 from the time t4.5 to the time t10. Moreover, during the cycle 2 of the synchronization signal 202, the digital pulsed signal 210 transitions at the time t10 from the logic level 1 to the logic level 0 and remains at the logic level 0 from the time t10 to a time t14.5. During the cycle 2 of the synchronization signal 202, the digital pulsed signal 210 transitions from the logic level 0 to the logic level 1 at the time t14.5 and stays at the logic level 1 from the time t14.5 to the time t20. As such, during each cycle of the synchronization signal 202, the digital pulsed signal 210 has the logic level 1 for a time period that occupies 55% of the cycle and has the logic level 0 for a remaining time period that occupies 45% of the cycle. Also, during each cycle of the synchronization signal 202, the digital pulsed signal 210 has an opposite logic level compared to a logic level of the digital pulsed signal 206 to be reversely synchronized with the digital pulsed signal 206. The duty cycle of the parameter of the RF signal 156 is provided within the recipe signal 154 that is sent from the processor 122 (FIGS. 1A and 1B) to the RF generator 104 (FIGS. 1A and 1B) via the transfer cable 134.

In one embodiment, instead of a 55% duty cycle, the digital pulsed signal 210 has a duty cycle that is greater than or less than 55%. For example, the digital pulsed signal to time has a duty cycle of 25% or 65% or 75%. To illustrate, when the digital pulsed signal 206 has a duty cycle of 55%, the digital pulsed signal 210 has a duty cycle of a difference between 100 and 55%, and the difference is 45%. As another illustration, when the digital pulsed signal 206 has a duty cycle of 25%, the digital pulsed signal 210 has a duty cycle of a difference between 100 and 25%, and the difference is 75%.

FIG. 2D is an embodiment of a graph 212 to illustrate a parameter 214 of an RF signal 216. The RF signal 216 is an example of the RF signal 152 generated by the RF generator 102 (FIGS. 1A and 1B). The graph 212 plots the parameter 214 on a y-axis and plots the time t on an x-axis.

An example of a parameter level of a parameter of an RF signal is an envelope, such as a peak-to-peak amplitude or a zero-to-peak amplitude, of the RF signal. For example, the parameter 214 is an envelope of the RF signal 216 and has a set of parameter levels P1 and −P1 during a portion of each cycle of the synchronization signal 202 and has a zero parameter level during the remaining portion of the cycle. To illustrate, a first parameter level includes one or more parameter values and a second parameter level includes one or more parameter values, and the one or more parameter values of the second parameter level are different from, such as exclusive of, the one or more values of the first parameter level. To further illustrate, when the first parameter level is greater than the second parameter level, a minimum of the one or more parameter values of the first parameter level is greater than a maximum of the one or more parameter values of the second parameter level.

The parameter 214 of the RF signal 216 is synchronized with the duty cycle of the digital pulsed signal 206 (FIG. 2B). For example, during the cycle 1 of the synchronization signal 202 (FIG. 2A), the parameter 214 transitions at the time to from a parameter level of zero to the parameter levels P1 and −P1. During the cycle 1 of the synchronization signal 202, the parameter 214 remains at the parameter levels P1 and −P1 from the time t0 to the time t4.5 and transitions at the time t4.5 from the parameter levels P1 and −P1 to the parameter level 0. Also, during the cycle 1 of the synchronization signal 202, the parameter 214 remains at the parameter level 0 from the time t4.5 to the time t10. Similarly, during the cycle 2 of the synchronization signal 202 (FIG. 2A), the parameter 214 transitions at the time t10 from the parameter level of zero to the parameter levels P1 and −P1. During the cycle 2 of the synchronization signal 202, the parameter 214 remains at the parameter levels P1 and −P1 from the time t10 to the time t14.5 and transitions at the time t14.5 from the parameter levels P1 and −P1 to the parameter level 0. Also, during the cycle 2 of the synchronization signal 202, the parameter 214 remains at the parameter level 0 from the time t14.5 to the time t20.

It should be noted that a set of parameter levels of an RF signal corresponds to a state of the RF signal. For example, the parameter levels P1 and −P1 define a state S1 of the RF signal 216 and the parameter level of zero defines a state S0 of the RF signal 216.

It should further be noted that each parameter level of an RF signal includes one or more values of a parameter of the RF signal. For example, the parameter level P1 includes multiple positive values of power or voltage of the RF signal 216 and the parameter level −P1 includes multiple negative values of power or voltage of the RF signal 216. As another example, the parameter level of zero includes multiple values of power or voltage of the RF signal 216. To illustrate, the parameter level of zero is substantially zero. To further illustrate, the parameter level of zero includes a set of two parameter levels with a first one of the two parameter levels being a positive parameter level between zero and the parameter level P1 and a second one of the two parameter levels being a negative parameter level between −P1 and zero. The positive and negative parameter levels are substantially zero, e.g., within a pre-determined range from zero. An example of the pre-determined range includes 1%-5%.

In one embodiment, instead of transitioning at the times t4.5 and t14.5 to the parameter level zero, the parameter 214 transitions at the times t4.5 and t14.5 to a positive parameter level greater than zero. For example, the parameter 214 transitions at each time t4.5 and t14.5 from the parameter level P1 to a positive parameter level between zero and P1 and from the parameter level −P1 to a negative parameter level between zero and −P1. The parameter 214 transitions at each time t10 and t20 from the positive parameter level to the parameter level P1 and from the negative parameter level to the parameter level −P1. The parameter levels P1 and −P1 define the state S1 of the RF signal 216 and the positive and negative parameter levels define the state S0 of the RF signal 216. It should be noted that one or more values of the positive parameter level are exclusive from one or more values of the parameter level P1 and one or more values of the negative parameter level are exclusive from one or more values of the parameter level −P1. For example, a minimum of the one or more values of the parameter level P1 is greater than a maximum of the one or more values of the positive parameter level and a minimum of one or more values of the negative parameter level is greater than a maximum of one or more values of the parameter level −P1.

In an embodiment, instead of a parameter of an RF signal transitioning from a first state to a second state at a time, the parameter transitions from the first state to the second state during a time period or a time interval. For example, the parameter 214 transitions from the state S1 to the state S0 during a time period, such as a time interval between the time t4.5 and a time t5.5 or a time interval between the time t4.5 and the time t5, instead of transitioning at the time t4.5. Similarly, instead of the parameter transitioning from the second state to the first state at a time, the parameter transitions from the second state to the first state during a time period or time interval.

FIG. 2E is an embodiment of a graph 218 to illustrate a parameter 220 of an RF signal 222. The RF signal 222 is an example of the RF signal 156 generated by the RF generator 104 (FIGS. 1A and 1B). The graph 218 plots the parameter 220 on a y-axis and plots the time t on an x-axis. The parameter 220 is an envelope of the RF signal 222.

The parameter 220 of the RF signal 222 is synchronized with the duty cycle of the digital pulsed signal 210 (FIG. 2C), and during each cycle of the synchronization signal 202, the parameter 220 has an opposite state compared to a state of the parameter 214 to be reversely synchronized with the parameter 214 (FIG. 2C). For example, during the cycle 1 of the synchronization signal 202 (FIG. 2A), the parameter 220 transitions at the time to from a set of parameter levels P2 and −P2 to the parameter level of zero, where P2 is a parameter level different from the parameter level P1. For example, the parameter level P1 is greater or lower than the parameter level P1.

During the cycle 1 of the synchronization signal 202, the parameter 220 remains at the parameter level of zero from the time t0 to the time t4.5 and transitions at the time t4.5 from the parameter level of zero to the parameter levels P2 and −P2. Also, during the cycle 1 of the synchronization signal 202, the parameter 220 remains at the parameter levels P2 and −P2 from the time t4.5 to the time t10. Similarly, during the cycle 2 of the synchronization signal 202 (FIG. 2A), the parameter 220 transitions at the time t10 from the parameter levels P2 and −P2 to the parameter level of zero. During the cycle 2 of the synchronization signal 202, the parameter 220 remains at the parameter level of zero from the time t10 to the time t14.5 and transitions at the time t14.5 from the parameter level of zero to the parameter levels P2 and −P2. Also, during the cycle 2 of the synchronization signal 202, the parameter 220 remains at the parameter levels P2 and −P2 from the time t14.5 to the time t20.

It should be noted that the parameter level of zero defines a state S0 of the RF signal 222 and the parameter levels P2 and −P2 defines a state S1 of the RF signal 222. It should further be noted that the parameter level P2 includes multiple positive values of power or voltage of the RF signal 222 and the parameter level −P2 includes multiple negative values of power or voltage of the RF signal 222. Also, in one embodiment, the parameter level of zero includes multiple values of power or voltage of the RF signal 222. To illustrate, the parameter level of zero of the parameter 220 of the RF signal 222 is substantially zero.

In one embodiment, instead of transitioning at the times to and t10 to the parameter level zero, the parameter 220 transitions at the times t0 and t10 to a positive parameter level greater than zero. For example, the parameter 220 transitions at each time t0 and t10 from the parameter level P2 to a positive parameter level between zero and P2 and from the parameter level −P2 to a negative parameter level between zero and −P2. The parameter 220 transitions at each time t4.5 and t14.5 from the positive parameter level to the parameter level P2 and from the negative parameter level to the parameter level −P2. The parameter levels P2 and −P2 define the state S1 of the RF signal 222 and the positive and negative parameter levels define the state S0 of the RF signal 222. It should be noted that one or more values of the positive parameter level are exclusive from one or more values of the parameter level P2 and one or more values of the negative parameter level are exclusive from one or more values of the parameter level −P2. For example, a minimum of the one or more values of the parameter level P2 is greater than a maximum of the one or more values of the positive parameter level and a minimum of one or more values of the negative parameter level is greater than a maximum of one or more values of the parameter level −P2.

In an embodiment, the parameter 220 transitions from the state S0 to the state S1 during a time period, such as a time interval between the time t4.5 and a time t5.5 or a time interval between the time t4.5 and the time t5, instead of transitioning at the time t4.5. Similarly, instead of the parameter transitioning from the second state to the first state at a time, the parameter 220 transitions from the second state to the first state during a time period or a time interval.

In one embodiment, the parameter level P2 is the same as or equal to the parameter level P1.

FIG. 3A is an embodiment of the graph 200 to illustrate the synchronization signal 202.

FIG. 3B is an embodiment of a graph 300 to illustrate a digital pulsed signal 302 for illustrating a duty cycle of the parameter of the RF signal 152 generated by the RF generator 102. The graph 300 plots a logic level of the digital pulsed signal 302 versus the time t. The logic level of the digital pulsed signal 302 is plotted on a y-axis and the time t is plotted on an x-axis.

The digital pulsed signal 302 has a duty cycle of 25% instead of 45%. For example, during the cycle 1 of the synchronization signal 202, the digital pulsed signal 302 transitions at the time to from the logic level 0 to the logic level 1 and remains at the logic level 1 from the time t0 to a time t2.5, which lies at half of a time period between the times t2 and t3. Also, during the cycle 1 of the synchronization signal 202, the digital pulsed signal 302 transitions from the logic level 1 to the logic level 0 at the time t2.5 and stays at the logic level 0 from the time t2.5 to the time t10. Moreover, during the cycle 2 of the synchronization signal 202, the digital pulsed signal 302 transitions at the time t10 from the logic level 0 to the logic level 1 and remains at the logic level 1 from the time t10 to a time t12.5. During the cycle 2 of the synchronization signal 202, the digital pulsed signal 302 transitions from the logic level 1 to the logic level 0 at the time t12.5 and stays at the logic level 0 from the time t12.5 to the time t20. As such, during each cycle of the synchronization signal 202, the digital pulsed signal 302 has the logic level 1 for a time period that occupies 25% of the cycle and has the logic level 0 for a remaining time period that occupies 75% of the cycle.

FIG. 3C is an embodiment of a graph 304 to illustrate a digital pulsed signal 306 for illustrating a duty cycle of the parameter of the RF signal 156 generated by the RF generator 104 (FIGS. 1A and 1B). The graph 304 plots a logic level of the digital pulsed signal 306 versus the time t. The logic level of the digital pulsed signal 306 is plotted on a y-axis and the time t is plotted on an x-axis.

The digital pulsed signal 306 has a duty cycle of 75% and is reversely synchronized with respect to the digital pulsed signal 302 (FIG. 3B). For example, during the cycle 1 of the synchronization signal 202, the digital pulsed signal 306 transitions at the time to from the logic level 1 to the logic level 0 and remains at the logic level 0 from the time t0 to the time t2.5. Also, during the cycle 1 of the synchronization signal 202, the digital pulsed signal 306 transitions from the logic level 0 to the logic level 1 at the time t2.5 and stays at the logic level 1 from the time t2.5 to the time t10. Moreover, during the cycle 2 of the synchronization signal 202, the digital pulsed signal 306 transitions at the time t10 from the logic level 1 to the logic level 0 and remains at the logic level 0 from the time t10 to a time t12.5. During the cycle 2 of the synchronization signal 202, the digital pulsed signal 306 transitions from the logic level 0 to the logic level 1 at the time t12.5 and stays at the logic level 1 from the time t12.5 to the time t20. As such, during each cycle of the synchronization signal 202, the digital pulsed signal 306 has the logic level 1 for a time period that occupies 75% of the cycle and has the logic level 0 for a remaining time period that occupies 25% of the cycle. Also, during each cycle of the synchronization signal 202, the digital pulsed signal 306 has an opposite logic level compared to a logic level of the digital pulsed signal 302 to be reversely synchronized with the digital pulsed signal 302.

FIG. 3D is an embodiment of a graph 308 to illustrate a parameter 310 of an RF signal 312. The RF signal 312 is an example of the RF signal 152 generated by the RF generator 102 (FIGS. 1A and 1B). The graph 308 plots the parameter 310 on a y-axis and plots the time t on an x-axis. As an example, the parameter 310 is an envelope of the RF signal 312.

The parameter 310 of the RF signal 312 is synchronized with the duty cycle of the digital pulsed signal 302 (FIG. 3B). For example, during the cycle 1 of the synchronization signal 202 (FIG. 3A), the parameter 310 transitions at the time to from the parameter level of zero to the parameter levels P1 and −P1. During the cycle 1 of the synchronization signal 202, the parameter 310 remains at the parameter levels P1 and −P1 from the time t0 to the time t2.5 and transitions at the time t2.5 from the parameter levels P1 and −P1 to the parameter level 0. Also, during the cycle 1 of the synchronization signal 202, the parameter 310 remains at the parameter level 0 from the time t2.5 to the time t10. Similarly, during the cycle 2 of the synchronization signal 202 (FIG. 3A), the parameter 310 transitions at the time t10 from the parameter level of zero to the parameter levels P1 and −P1. During the cycle 2 of the synchronization signal 202, the parameter 310 remains at the parameter levels P1 and −P1 from the time t10 to the time t12.5 and transitions at the time t12.5 from the parameter levels P1 and −P1 to the parameter level 0. Also, during the cycle 2 of the synchronization signal 202, the parameter 310 remains at the parameter level 0 from the time t12.5 to the time t20.

It should be noted that the parameter levels P1 and −P1 define a state S1 of the RF signal 312 and the parameter level of zero defines a state S0 of the RF signal 312.

It should further be noted that the parameter level P1 includes multiple positive values of power or voltage of the RF signal 312 and the parameter level −P1 includes multiple negative values of power or voltage of the RF signal 312. Also, in an embodiment, the parameter level of zero includes multiple values of power or voltage of the RF signal 312. To illustrate, the parameter level of zero is substantially zero.

In one embodiment, instead of transitioning at the times t2.5 and t12.5 to the parameter level zero, the parameter 310 transitions at the times t2.5 and t12.5 to a positive parameter level greater than zero. For example, the parameter 310 transitions at each time t2.5 and t12.5 from the parameter level P1 to a positive parameter level between zero and P1 and from the parameter level −P1 to a negative parameter level between zero and −P1. The parameter 310 transitions each time t10 and t20 from the positive parameter level to the parameter level P1 and from the negative parameter level to the parameter level −P1. The parameter levels P1 and −P1 define the state S1 of the RF signal 312 and the positive and negative parameter levels define the state S0 of the RF signal 312.

In an embodiment, the parameter 310 transitions from the state S1 to the state S0 during a time period, such as a time interval between the time t2.5 and a time t3.5 or a time interval between the time t2.5 and the time t3, instead of transitioning at the time t2.5. The time t3.5 lies at half of a time period between the times t3 and t4. Similarly, instead of the parameter transitioning from the state S0 to the state S1 at a time, the parameter 310 transitions from the state S0 to the state S1 during a time period or time interval.

FIG. 3E is an embodiment of a graph 314 to illustrate a parameter 316 of an RF signal 318. The RF signal 318 is an example of the RF signal 156 generated by the RF generator 104 (FIGS. 1A and 1B). The graph 314 plots the parameter 316 on a y-axis and plots the time t on an x-axis. The parameter 316 is an envelope of the RF signal 318.

The parameter 316 of the RF signal 318 is synchronized with the duty cycle of the digital pulsed signal 306 (FIG. 3C), and during each cycle of the synchronization signal 202, the parameter 316 has an opposite state compared to a state of the parameter 310 to be reversely synchronized with the parameter 310. For example, during the cycle 1 of the synchronization signal 202 (FIG. 3A), the parameter 316 transitions at the time t0 from the set of parameter levels P2 and −P2 to the parameter level of zero. During the cycle 1 of the synchronization signal 202, the parameter 316 remains at the parameter level of zero from the time t0 to the time t2.5 and transitions at the time t2.5 from the parameter level of zero to the parameter levels P2 and −P2. Also, during the cycle 1 of the synchronization signal 202, the parameter 316 remains at the parameter levels P2 and −P2 from the time t2.5 to the time t10. Similarly, during the cycle 2 of the synchronization signal 202 (FIG. 3A), the parameter 316 transitions at the time t10 from the parameter levels P2 and −P2 to the parameter level of zero. During the cycle 2 of the synchronization signal 202, the parameter 316 remains at the parameter level of zero from the time t10 to the time t12.5 and transitions at the time t12.5 from the parameter level of zero to the parameter levels P2 and −P2. Also, during the cycle 2 of the synchronization signal 202, the parameter 316 remains at the parameter levels P2 and −P2 from the time t12.5 to the time t20.

It should be noted that the parameter level of zero defines a state S0 of the RF signal 318 and the parameter levels P2 and −P2 defines a state S1 of the RF signal 318. It should further be noted that the parameter level P2 includes multiple positive values of power or voltage of the RF signal 318 and the parameter level −P2 includes multiple negative values of power or voltage of the RF signal 318. Also, in one embodiment, the parameter level of zero includes multiple values of power or voltage of the RF signal 318. To illustrate, the parameter level of zero of the parameter 316 of the RF signal 318 is substantially zero.

In one embodiment, instead of transitioning at the times t0 and t10 to the parameter level zero, the parameter 316 transitions at the times t0 and t10 to a positive parameter level greater than zero. For example, the parameter 316 transitions at each time t0 and t10 from the parameter level P2 to a positive parameter level between zero and P2 and from the parameter level −P2 to a negative parameter level between zero and −P2. The parameter 316 transitions each time t2.5 and t12.5 from the positive parameter level to the parameter level P2 and from the negative parameter level to the parameter level −P2. The parameter levels P2 and −P2 define the state S1 of the RF signal 318 and the positive and negative parameter levels define the state S0 of the RF signal 318.

In an embodiment, the parameter 316 transitions from the state S0 to the state S1 during a time period, such as a time interval between the time t2.5 and the time t3.5 or a time interval between the time t2.5 and the time t3, instead of transitioning at the time t2.5. Similarly, instead of the parameter transitioning from the state S1 to the state S0 at a time, the parameter 316 transitions from the state S1 to the state S0 during a time period or time interval.

Figure 4A:
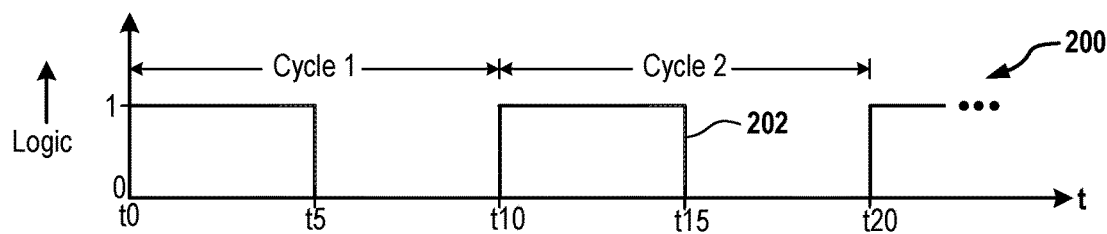
FIG. 4A is an embodiment of the graph of FIG. 2A to illustrate the synchronization signal.

FIG. 4A is an embodiment of the graph 200 to illustrate the synchronization signal 202.

FIG. 4B is an embodiment of a graph 400 to illustrate a digital pulsed signal 402 for illustrating a duty cycle of the parameter of the RF signal 152 generated by the RF generator 102. The graph 400 plots a logic level of the digital pulsed signal 402 versus the time t. The logic level of the digital pulsed signal 402 is plotted on a y-axis and the time t is plotted on an x-axis.

The digital pulsed signal 402 has a duty cycle of 45% and the duty cycle is split between two time intervals. For example, during the cycle 1 of the synchronization signal 202, the digital pulsed signal 402 transitions at the time t0 from the logic level 0 to the logic level 1 and remains at the logic level 1 from the time t0 to the time t2. Also, during the cycle 1 of the synchronization signal 202, the digital pulsed signal 402 transitions from the logic level 1 to the logic level 0 at the time t2 and stays at the logic level 0 from the time t2 to the time t5. Furthermore, during the cycle 1 of the synchronization signal 202, the digital pulsed signal 402 transitions at the time t5 from the logic level 0 to the logic level 1 and remains at the logic level 1 from the time t5 to a time t7.5, which lies at half of a time interval from the time t7 to the time t8. Also, during the cycle 1 of the synchronization signal 202, the digital pulsed signal 402 transitions from the logic level 1 to the logic level 0 at the time t7.5 and stays at the logic level 0 from the time t7.5 to the time t10. The time period that occupies 45% of the cycle 1 is split between the time interval between the times t0 and t2 and the time interval between the times t5 and t7.5. The time period that occupies 55% of the cycle 1 is split between the time interval between the times t2 and t5 and the time interval between the times t7.5 and t10.

Moreover, during the cycle 2 of the synchronization signal 202, the digital pulsed signal 402 transitions at the time t10 from the logic level 0 to the logic level 1 and remains at the logic level 1 from the time t10 to a time t12. During the cycle 2 of the synchronization signal 202, the digital pulsed signal 402 transitions from the logic level 1 to the logic level 0 at the time t12 and stays at the logic level 0 from the time t12 to the time t15. Also, during the cycle 2 of the synchronization signal 202, the digital pulsed signal 402 transitions at the time t15 from the logic level 0 to the logic level 1 and remains at the logic level 1 from the time t15 to a time t17.5, which lies at half of a time interval between the times t17 and t18. During the cycle 2 of the synchronization signal 202, the digital pulsed signal 402 transitions from the logic level 1 to the logic level 0 at the time t17.5 and stays at the logic level 0 from the time t17.5 to the time t20. The time period that occupies 45% of the cycle 2 is split between the time interval between the times t10 and t12 and the time interval between the times t15 and t17.5. The time period that occupies 55% of the cycle 2 is split between the time interval between the times t12 and t15 and the time interval between the times t17.5 and t20. As such, during each cycle of the synchronization signal 202, the digital pulsed signal 402 has the logic level 1 for a time period that occupies 45% of the cycle and has the logic level 0 for a remaining time period that occupies 55% of the cycle. The duty cycle of 45% is split between two time intervals and the logic level of zero is also split between two time intervals.

FIG. 4C is an embodiment of a graph 404 to illustrate a digital pulsed signal 406 for illustrating a duty cycle of the parameter of the RF signal 156 generated by the RF generator 104. The graph 404 plots a logic level of the digital pulsed signal 406 versus the time t. The logic level of the digital pulsed signal 406 is plotted on a y-axis and the time t is plotted on an x-axis.

The digital pulsed signal 406 has a duty cycle of 55%, which is split between two time intervals, and is reversely synchronized with respect to the digital pulsed signal 402 (FIG. 4B). For example, during the cycle 1 of the synchronization signal 202, the digital pulsed signal 406 transitions at the time to from the logic level 1 to the logic level 0 and remains at the logic level 0 from the time t0 to the time t2. Also, during the cycle 1 of the synchronization signal 202, the digital pulsed signal 406 transitions from the logic level 0 to the logic level 1 at the time t2 and stays at the logic level 1 from the time t2 to the time t5. During the cycle 1 of the synchronization signal 202, the digital pulsed signal 406 transitions at the time t5 from the logic level 1 to the logic level 0 and remains at the logic level 0 from the time t5 to the time t7.5. Also, during the cycle 1 of the synchronization signal 202, the digital pulsed signal 406 transitions from the logic level 0 to the logic level 1 at the time t7.5 and stays at the logic level 1 from the time t7.5 to the time t10.

Moreover, during the cycle 2 of the synchronization signal 202, the digital pulsed signal 406 transitions at the time t10 from the logic level 1 to the logic level 0 and remains at the logic level 0 from the time t10 to the time t12. During the cycle 2 of the synchronization signal 202, the digital pulsed signal 406 transitions from the logic level 0 to the logic level 1 at the time t12 and stays at the logic level 1 from the time t12 to the time t15. During the cycle 2 of the synchronization signal 202, the digital pulsed signal 406 transitions at the time t15 from the logic level 1 to the logic level 0 and remains at the logic level 0 from the time t15 to the time t17.5. During the cycle 2 of the synchronization signal 202, the digital pulsed signal 406 transitions from the logic level 0 to the logic level 1 at the time t17.5 and stays at the logic level 1 from the time t17.5 to the time t20. As such, during each cycle of the synchronization signal 202, the digital pulsed signal 406 has the logic level 1 for a time period that occupies 55% of the cycle and has the logic level 0 for a remaining time period that occupies 45% of the cycle. A duty cycle of the digital pulsed signal 406 is 55%. Also, during each cycle of the synchronization signal 202, the digital pulsed signal 406 has an opposite logic level compared to a logic level of the digital pulsed signal 402 to be reversely synchronized with the digital pulsed signal 402.

Figure 4D:
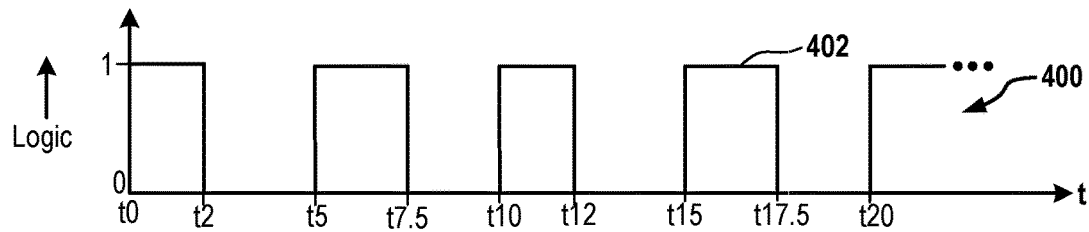
FIG. 4D is an embodiment of a graph to illustrate a parameter of an RF signal.
Figure 4D:
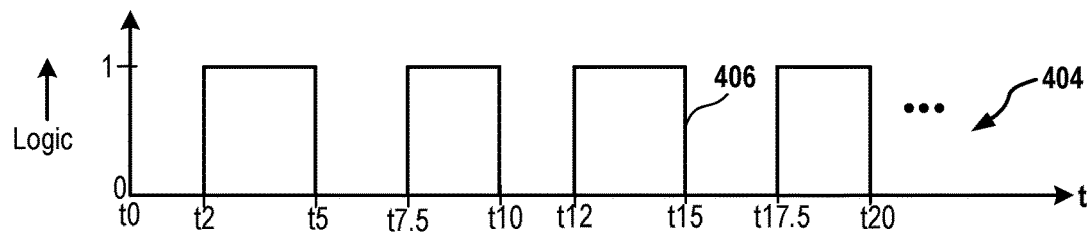
Figure 4D:
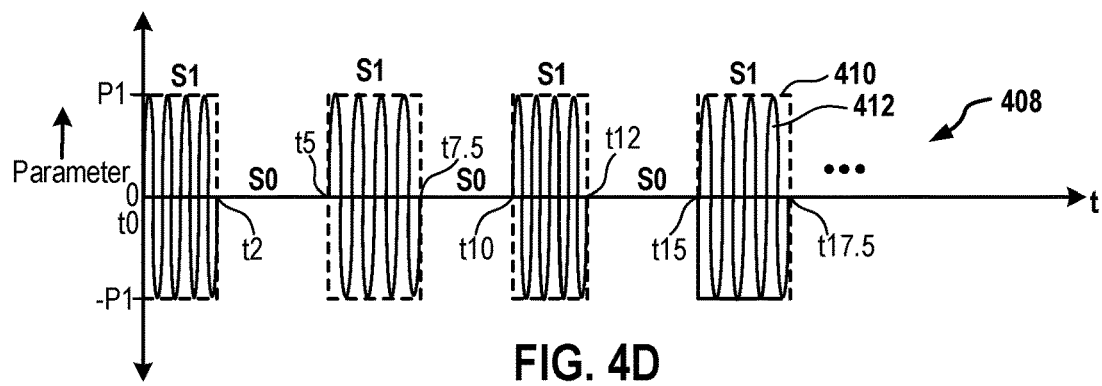

FIG. 4D is an embodiment of a graph 408 to illustrate a parameter 410 of an RF signal 412. The RF signal 412 is an example of the RF signal 152 generated by the RF generator 102 (FIGS. 1A and 1B). The graph 408 plots the parameter 410 on a y-axis and plots the time t on an x-axis. As an example, the parameter 410 is an envelope of the RF signal 412.

The parameter 410 of the RF signal 412 is synchronized with the duty cycle of the digital pulsed signal 402 (FIG. 4B). For example, during the cycle 1 of the synchronization signal 202 (FIG. 4A), the parameter 410 transitions at the time to from a parameter level of zero to the parameter levels P1 and −P1. During the cycle 1 of the synchronization signal 202, the parameter 410 remains at the parameter levels P1 and −P1 from the time t0 to the time t2 and transitions at the time t2 from the parameter levels P1 and −P1 to the parameter level 0. Also, during the cycle 1 of the synchronization signal 202, the parameter 410 remains at the parameter level 0 from the time t2 to the time t5. Moreover, during the cycle 1 of the synchronization signal 202, the parameter 410 remains at the parameter levels P1 and −P1 from the time t5 to the time t7.5 and transitions at the time t7.5 from the parameter levels P1 and −P1 to the parameter level 0. Also, during the cycle 1 of the synchronization signal 202, the parameter 410 remains at the parameter level 0 from the time t7.5 to the time t10.

Similarly, during the cycle 2 of the synchronization signal 202 (FIG. 3A), the parameter 410 transitions at the time t10 from the parameter level of zero to the parameter levels P1 and −P1. During the cycle 2 of the synchronization signal 202, the parameter 410 remains at the parameter levels P1 and −P1 from the time t10 to the time t12 and transitions at the time t12 from the parameter levels P1 and −P1 to the parameter level 0. Also, during the cycle 2 of the synchronization signal 202, the parameter 410 remains at the parameter level 0 from the time t12 to the time t15, and transitions at the time t15 from the parameter level 0 to the parameter levels P1. During the cycle 2 of the synchronization signal 202, parameter 410 remains at the parameter levels P1 and −P1 from the time t15 to the time t17.5 and transitions at the time t17.5 from the parameter levels P1 and −P1 to the parameter level zero. During the cycle 2 of the synchronization signal 202, the parameter 410 remains at the parameter level zero from the time t17.5 to the time t20. It should be noted that the parameter levels P1 and −P1 define a state S1 of the RF signal 412 and the parameter level of zero defines a state S0 of the RF signal 412.

It should further be noted that the parameter level P1 includes multiple positive values of power or voltage of the RF signal 412 and the parameter level −P1 includes multiple negative values of power or voltage of the RF signal 412. Also, in an embodiment, the parameter level of zero includes multiple values of power or voltage of the RF signal 412. To illustrate, the parameter level of zero is substantially zero.

In one embodiment, instead of transitioning at the times t2 and t7.5 to the parameter level zero, the parameter 410 transitions at the times t2 and t7.5 to a positive parameter level greater than zero. For example, the parameter 410 transitions at each time t2 and t7.5 from the parameter level P1 to a positive parameter level between zero and P1 and from the parameter level −P1 to a negative parameter level between zero and −P1. The parameter 410 transitions each time t0 and t5 from the positive parameter level to the parameter level P1 and from the negative parameter level to the parameter level −P1. The parameter levels P1 and −P1 define the state S1 of the RF signal 412 and the positive and negative parameter levels define the state S0 of the RF signal 412.

In an embodiment, the parameter 410 transitions from the state S1 to the state S0 during a time period, such as a time interval between the time t2 and a time t3 or a time interval between the time t2 and the time t2.5, instead of transitioning at the time t2. Similarly, instead of the parameter 410 transitioning from the state S0 to the state S1 at a time, the parameter 410 transitions from the second state to the first state during a time period or time interval.

It should be noted that although two instances of pulsing of the parameter 410 are illustrated in FIG. 4D, in one embodiment, more than instances of pulsing of the parameter 410 occur during each cycle of the synchronization signal 202. For example, in addition to having two instances of pulsing as illustrated in FIG. 4D during the cycle 1 of the synchronization signal 202, the parameter 410 pulses, such as transitions, from the parameter level 0 to the parameter levels P1 and −P1 at the time t8 and remains at the parameter levels P1 and −P1 from the time t8 to the time t9. During the cycle 1 of the synchronization signal 202, the parameter 410 pulses at the time t9 from the parameter levels P1 and −P1 to the parameter level of zero and remains at the parameter level of zero from the time t9 to the time t10. In this example, the parameter 410 has pulsed thrice instead of twice during the cycle 1 of the synchronization signal 202.

Figure 4E:
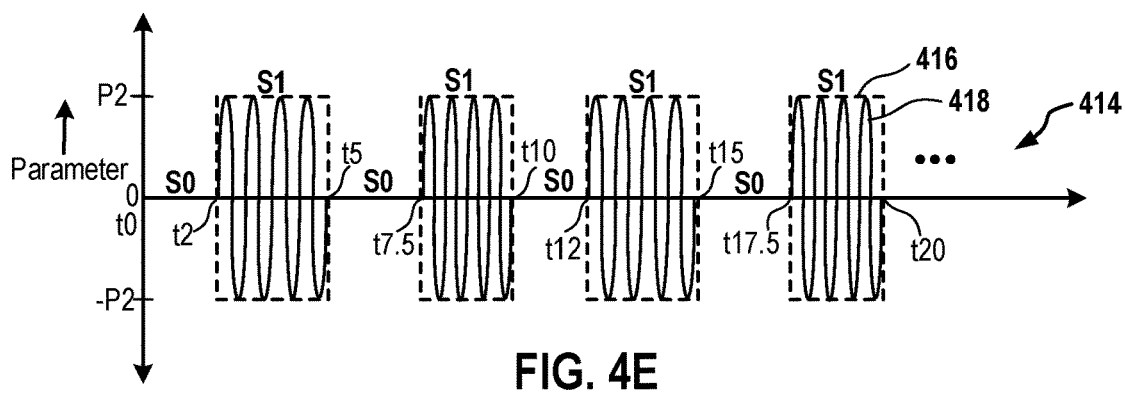
FIG. 4E is an embodiment of a graph to illustrate a parameter of an RF signal.

FIG. 4E is an embodiment of a graph 414 to illustrate a parameter 416 of an RF signal 418. The RF signal 418 is an example of the RF signal 156 generated by the RF generator 104 (FIGS. 1A and 1B). The graph 414 plots the parameter 416 on a y-axis and plots the time t on an x-axis. The parameter 416 is an envelope of the RF signal 418.

The parameter 416 of the RF signal 418 is synchronized with the duty cycle of the digital pulsed signal 406 (FIG. 4C), and during each cycle of the synchronization signal 202, the parameter 416 has an opposite state compared to a state of the parameter 410 to be reversely synchronized with the parameter 410. For example, during the cycle 1 of the synchronization signal 402 (FIG. 4A), the parameter 416 transitions at the time to from the set of parameter levels P2 and −P2 to the parameter level of zero. During the cycle 1 of the synchronization signal 202, the parameter 416 remains at the parameter level of zero from the time t0 to the time t2 and transitions at the time t2 from the parameter level of zero to the parameter levels P2 and −P2. Also, during the cycle 1 of the synchronization signal 202, the parameter 416 remains at the parameter levels P2 and −P2 from the time t2 to the time t5. Furthermore, during the cycle 1 of the synchronization signal 202, the parameter 416 remains at the parameter level of zero from the time t5 to the time t7.5 and transitions at the time t7.5 from the parameter level of zero to the parameter levels P2 and −P2. Also, during the cycle 1 of the synchronization signal 202, the parameter 416 remains at the parameter levels P2 and −P2 from the time t7.5 to the time t10.

Similarly, during the cycle 2 of the synchronization signal 202 (FIG. 3A), the parameter 416 transitions at the time t10 from the parameter levels P2 and −P2 to the parameter level of zero. During the cycle 2 of the synchronization signal 202, the parameter 416 remains at the parameter level of zero from the time t10 to the time t12 and transitions at the time t12 from the parameter level of zero to the parameter levels P2 and −P2. Also, during the cycle 2 of the synchronization signal 202, the parameter 416 remains at the parameter levels P2 and −P2 from the time t12 to the time t15. Further, during the cycle 2 of the synchronization signal 202, the parameter 416 remains at the parameter level of zero from the time t15 to the time t17.5 and transitions at the time t17.5 from the parameter level of zero to the parameter levels P2 and −P2. Also, during the cycle 2 of the synchronization signal 202, the parameter 416 remains at the parameter levels P2 and −P2 from the time t17.5 to the time t20.

It should be noted that the parameter level of zero defines a state S0 of the RF signal 418 and the parameter levels P2 and −P2 defines a state S1 of the RF signal 418. It should further be noted that the parameter level P2 includes multiple positive values of power or voltage of the RF signal 418 and the parameter level −P2 includes multiple negative values of power or voltage of the RF signal 418. Also, in an embodiment, the parameter level of zero includes multiple values of power or voltage of the RF signal 418. To illustrate, the parameter level of zero of the parameter 416 of the RF signal 418 is substantially zero.

In one embodiment, instead of transitioning at the times to and t10 to the parameter level zero, the parameter 416 transitions at the times t0 and t10 to a positive parameter level greater than zero. For example, the parameter 416 transitions at each time to and t10 from the parameter level P2 to a positive parameter level between zero and P2 and from the parameter level −P2 to a negative parameter level between zero and −P2. The parameter 416 transitions each time t2 and t7.5 from the positive parameter level to the parameter level P2 and from the negative parameter level to the parameter level −P2. The parameter levels P2 and −P2 define the state S1 of the RF signal 418 and the positive and negative parameter levels define the state S0 of the RF signal 418.

In an embodiment, the parameter 416 transitions from the state S0 to the state S1 during a time period, such as a time interval between the time t2 and the time t3 or a time interval between the time t2 and the time t2.5, instead of transitioning at the time t2. Similarly, instead of the parameter 416 transitioning from the state S1 to the state S0 at a time, the parameter 416 transitions from the state S1 to the state S0 during a time period or time interval.

It should be noted that although two instances of pulsing of the parameter 416 are illustrated in FIG. 4E, in one embodiment, more than instances of pulsing of the parameter 416 occur during each cycle of the synchronization signal 202. For example, in addition to having two instances of pulsing from the time t2 to the time t5 and the time t7.5 to the time t10 as illustrated in FIG. 4E during the cycle 1 of the synchronization signal 202, the parameter 416 pulses, such as transitions, from the parameter level zero to the parameter levels P2 and −P2 at the time t6 and remains at the parameter levels P2 and −P2 from the time t6 to the time t7. During the cycle 1 of the synchronization signal 202, the parameter 416 pulses at the time t7 from the parameter levels P2 and −P2 to the parameter level zero and remains at the parameter level zero from the time t7 to the time t7.5 In this example, the parameter 416 has pulsed thrice instead of twice during the cycle 1 of the synchronization signal 202.

Figure 5:
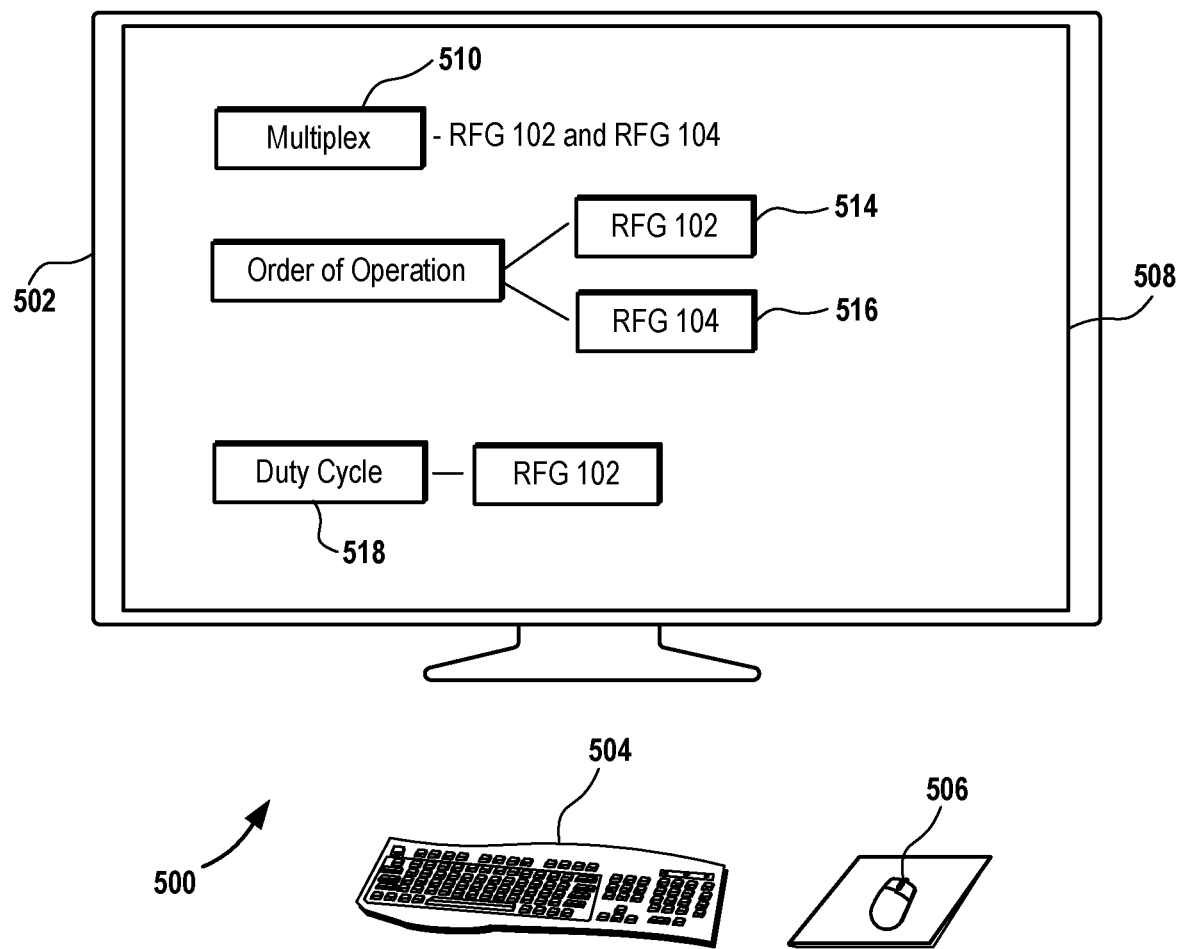
FIG. 5 is a diagram of a computer system to illustrate a user interface for illustrating a control of multiplexing operation between multiple RF generators.

FIG. 5 is a diagram of a computer system 500 to illustrate a user interface for illustrating a control of multiplexing operation of the RF generators 102 and 104 (FIG. 1A). The computer system 500 is an example of the host computer 120 (FIG. 1A). The system 500 includes a display device 502, a keyboard 504, and an optical mouse 506. The display device 502, the keyboard 504, and the optical mouse 506 are examples of input devices. For example, the display device 502 has a touchscreen for receiving a selection from a user. The touchscreen is an example of an input device. An example of the display device 502 includes a combination of a display screen 508, a central processing unit (CPU), a memory device, and a graphical processing unit (GPU). The CPU, the GPU, the memory device, and the display screen 508 of the display device 502 are coupled to each other via a bus. The CPU of the display device 502 is an example of the processor 122 (FIG. 1A) of the host computer 120. The keyboard 504 and the optical mouse 506 are coupled wirelessly with the CPU of the display device 502.

During operation, the CPU and the GPU controls the display screen 508 to display a graphical button 510 to select a multiplexing operation for time division multiplexing of the RF signals 152 and 156 (FIGS. 1A and 1B). For example, in response to receiving a selection from the user via the keyboard 504 or the optical mouse 506 or the touchscreen of the graphical button 510, the CPU generates the duty cycles illustrated in FIGS. 2B, 2C, 3B, 3C, 4B, and 4C for sending to the corresponding RF generators 102 and 104. The duty cycle of the RF generator 104 is reversely synchronized compared to the duty cycle of the RF generator 102.

Also, the CPU and the GPU controls the display screen 508 to display a graphical button 512 to receive a selection regarding whether the RF generator 102 is to start with the state S1 at the time to or the RF generator 104 is to start with the state S1 at the time to. For example, in response to receiving a selection of a graphical button 514, the CPU determines to control the RF generator 102 to start at the state S1 at the time to and to control the RF generator 104 to start the state S0 of the time t0. As another example, in response to receiving a selection of a graphical button 516, the CPU determines to control the RF generator 104 to start at the state S1 at the time to and to control the RF generator 102 to start the state S0 of the time t0. This selection regarding whether the RF generator 102 is to start with the state S1 at the time t0 or the RF generator 104 is to start with the state S1 at the time to is received from the user via the keyboard 504 or the optical mouse 506 or the touchscreen.

The CPU and the GPU also controls the display screen 508 to display a graphical button 518 to receive a duty cycle of the RF generator 102. For example, a duty cycle of 25% or 35% or 45% or 28% of operation of the RF generator 102 is received from the user via the keyboard 504 or the optical mouse 506 or the touchscreen.

It should be noted that in response to receiving a selection of the graphical buttons 510, and 512, and 514 or 516, and 518, the recipe signals 150 and 154 (FIGS. 1A and 1B) are generated. For example, the recipe signal 150 includes a duty cycle of operation of the RF generator 102 for generating the state S1 of the parameter of the RF signal 152 and the recipe signal 154 includes a duty cycle of operation of the RF generator 104 for generating the state S1 of the parameter of the RF signal 156. Also, the recipe signal 150 includes an instruction from the processor 122 (FIG. 1A) to the RF generator 102 to operate in reverse synchronization with an operation of the RF generator 104. Similarly, the recipe signal 154 includes an instruction from the processor 122 (FIG. 1A) to the RF generator 104 to operate in reverse synchronization with an operation of the RF generator 102.

In one embodiment, instead of the CPU being included within the display device 502, the CPU is implemented within a housing that is separate from a housing of the display device 502.

In an embodiment, each of the keyboard 504 and the optical mouse 506 is coupled via a wired connection, such as a cable, to the CPU of the display device 502. For example, each of the keyboard 504 and the optical mouse 506 is coupled via a universal serial bus (USB) cable to the CPU of the display device 502.

In one embodiment, instead of the graphical button, a drop-down menu is displayed on the display screen 508 by the CPU and the GPU.

FIG. 6A is an embodiment of a graph 600 to illustrate a plot 602 of flux n of ions of plasma within the plasma chamber 118 or 174 (FIGS. 1A and 1B) versus a radius r of the substrate S placed within the plasma chamber. The ion flux is plotted on a y-axis and the radius r is plotted on an x-axis. The plot 602 is generated when the parameter of the RF signal 152 generated by the RF generator 102 (FIGS. 1A and 1B) has the state S1 and when the parameter of the RF signal 156 generated by the RF generator 104 has the state S0 for one cycle of the synchronization signal 162 (FIGS. 1A and 1B). It should be noted from the plot 602 that the ion density decreases from a center 0 of the substrate S to a positive value R of the radius r of the substrate S.

The graph 600 further includes a plot 604 of a thickness s of plasma sheath, such as a top plasma sheath, of the plasma within the plasma chamber 118 or 174 versus the radius R of the substrate S. It should be noted from the plot 604 that the thickness s of the plasma sheath increases along the radius r of the substrate S from the center 0 to the positive value R of the radius R of the substrate. For example, the thickness s increases from a minimum value smin1 at the center 0 of the substrate S to a maximum value smax1 closer to the radius R. The values smin1 and smax1 are measured from a reference value sref of the thickness s. For example, the reference value sref1 is a value at a bottom surface of the plasma sheath and the values smin1 and smax1 are values at a top surface of the plasma sheath.

It should further be noted that the ion flux is inversely proportional to the square of the thickness s or the thickness s is inversely proportional to the square root of the ion flux. Also, a variable x is a difference between the maximum thickness smax of the plasma sheath and the minimum thickness smin of the plasma sheath. An angular tilt $\phi$ of ions of the plasma within the plasma chamber 118 or 174 is a tangent inverse of a ratio of the difference x and the radius r. For the plot 604, the angular tilt has a value $\phi$1 at a radius value R1 of the radius R of the substrate S. The value $\phi$1 is measured with respect to a vertical line 605 at the radius value R1.

In one embodiment, the plot 602 is of density of ions of plasma within the plasma chamber 118 or 174.

FIG. 6B is an embodiment of a graph 606 to illustrate a plot 608 of the flux $\eta$ of ions of plasma within the plasma chamber 118 or 174 (FIGS. 1A and 1B) versus the radius r of the substrate S placed within the plasma chamber. The ion flux $\eta$ is plotted on a y-axis and the radius r is plotted on an x-axis. The plot 608 is generated when the parameter of the RF signal 156 generated by the RF generator 104 (FIGS. 1A and 1B) has the state S1 and when the parameter of the RF signal 152 generated by the RF generator 102 has the state S0 for one cycle of the synchronization signal 162 (FIGS. 1A and 1B). It should be noted from the plot 608 that the ion density increases from the center 0 of the substrate S to the positive value R of the radius r of the substrate S.

The graph 606 further includes a plot 610 of the thickness s of plasma sheath, such as the top plasma sheath, of the plasma within the plasma chamber 118 or 174 versus the radius R of the substrate S. It should be noted from the plot 610 that the thickness s of the plasma sheath decreases along the radius r of the substrate S from the center 0 to the positive value R of the radius R of the substrate. For example, the thickness s decreases from a maximum value smax2 at the center 0 of the substrate S to a minimum value smin2 closer to the radius R. The values smin2 and smax2 are measured from the reference value sref of the thickness s. For example, the values smin2 and smax2 are values at the top surface of the plasma sheath.

Also, for the plot 610, the angular tilt has a value φ2 at the radius value R1 of the radius R of the substrate S. The value φ2 is measured with respect to the vertical line 605 at the radius value R1.

In one embodiment, the plot 610 is of density of ions of plasma within the plasma chamber 118 or 174.

In an embodiment, the angle φ1 or φ2 is 200 millidegrees or greater. For example, the angle φ1 is 0.2 degrees or 0.3 degrees. The angle φ1 or φ2 results in nonuniform plasma. For example, nonuniformity of plasma within the plasma chamber 118 increases to be approximately 24 percent.

Figure 6C:
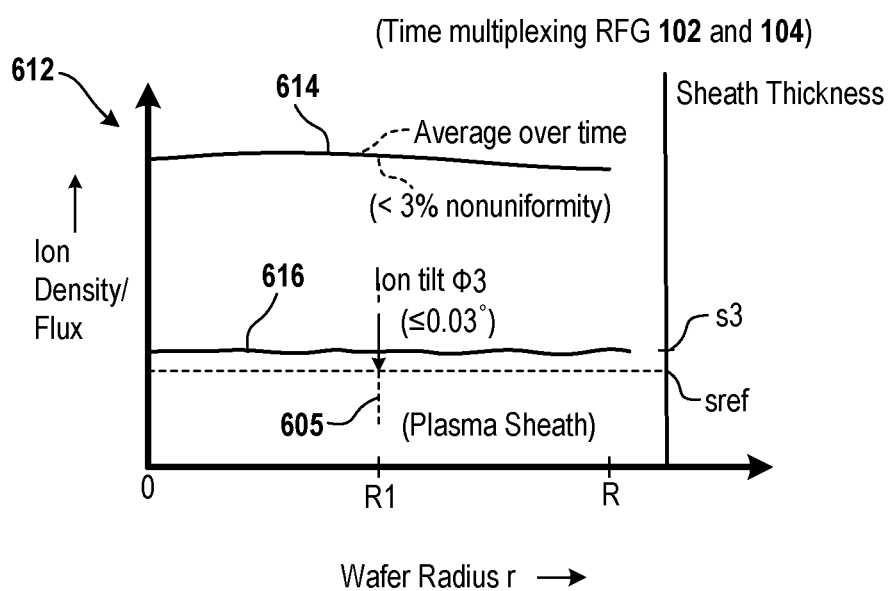
FIG. 6C is an embodiment of a graph to illustrate a plot of the flux of ions of plasma within the plasma chamber versus the radius of the substrate placed within the plasma chamber.

FIG. 6C is an embodiment of a graph 612 to illustrate a plot 614 of the flux η of ions of plasma within the plasma chamber 118 or 174 (FIGS. 1A and 1B) versus the radius r of the substrate S placed within the plasma chamber. The ion flux η is plotted on a y-axis and the radius r is plotted on an x-axis. The plot 614 is generated when the parameter of the RF signal 156 generated by the RF generator 104 (FIGS. 1A and 1B) is reversely synchronized with respect to the parameter of the RF signal 152 generated by the RF generator 102 over the time t for multiple cycles, such as over 10 cycles or 20 cycles or 30 cycles, of the synchronization signal 162 (FIGS. 1A and 1B). It should be noted from the plot 614 that the ion density is substantially constant from the center 0 of the substrate S to the positive value R of the radius r of the substrate S. For example, compared to the plot 602 (FIG. 6A), the ion density of the plot 614 does not decrease substantially along the radius r from the center 0 to the value R. Also, compared to the plot 608 (FIG. 6B), the ion density of the plot 614 does not increase substantially along the radius r from the center 0 to the value R.

The graph 612 further includes a plot 616 of the thickness s of plasma sheath, such as the top plasma sheath, of the plasma within the plasma chamber 118 or 174 versus the radius R of the substrate S. It should be noted from the plot 616 that the thickness s of the plasma sheath is substantially constant along the radius r of the substrate S from the center 0 to the positive value R of the radius R of the substrate. For example, the thickness s is substantially the same thickness value s3 and does not decrease from the maximum value smax2 to the minimum value smin2 and does not increase from the minimum value smin1 to the maximum value smax1. The value s3 is measured from the reference value sref of the thickness s. For example, the value s3 is a thickness of the top surface of the plasma sheath measured with respect to a bottom surface of the plasma sheath.

Also, for the plot 616, the angular tilt has a value φ3 at the radius value R1 of the radius R of the substrate S. The value φ3 is measured with respect to the vertical line 605 at the radius value R1. An example of φ3 is an angle that ranges between 0 degrees and 0.03 degrees, and therefore is barely visible in FIG. 6C. To illustrate, the angle φ3 is 20 millidegrees or 30 millidegrees. The angle φ3 results in uniform plasma. For example, nonuniformity of plasma within the plasma chamber 118 is reduced to be less than or equal to 3 percent.

In one embodiment, the plot 610 is of density of ions of plasma within the plasma chamber 118 or 174.

FIG. 7A is a diagram of an embodiment to illustrate a substrate 700 that is etched when both the RF generators 102 and 104 have the same state, such as S1 or S0, over multiple cycles of the synchronization signal 162 (FIG. 1A). Also, the substrate 700 is illustrative of etching achieved when the RF generator 102 has the state S1 and the RF generator 104 has the state S0 for one cycle of the synchronization signal 162 (FIG. 1A). The substrate 700 includes a substrate layer 702 and a substrate stack layer 704. An example of the substrate layer includes a silicon layer 702. An example of the substrate stack layer 704 includes one or more layers, such as an oxide layer, a metal layer, and a mask layer. Within the substrate stack layer 704 features, such as a feature 706, are etched when the RF generators 102 and 104 are not operated in reverse synchronization each other, e.g., have the same state. When the RF generators 102 and 104 are not operated in reverse synchronization with each other, the angular tilt φ1 is large with respect to the vertical line 605. Density of ions of plasma within the plasma chamber 118 (FIG. 1A) increases at the edge region of the substrate S and decreases at the central region of the substrate S. Plasma sheath of the plasma is thick at the edge region 131 and thin at the central region 129 (FIG. 1A). Because of the greater density at the edge region 131 compared to the central region 129, the feature 706 is tilted at the angle φ1 with respect to the vertical line 605.

FIG. 7B is a diagram of an embodiment to illustrate a substrate 710 that is etched when both the RF generators 102 and 104 have the same state, such as S1 or S0, during each cycle of the synchronization signal 162 (FIG. 1A) for multiple cycles of the synchronization signal 162. Also, the substrate 710 is illustrative of etching achieved when the RF generator 1042 has the state S1 and the RF generator 102 has the state S0 for one cycle of the synchronization signal 162 (FIG. 1A). The substrate 710 includes the substrate layer 702 and the substrate stack layer 704. Within the substrate stack layer 704 features, such as a feature 712, are etched when the RF generators 102 and 104 are not operated in reverse synchronization each other, e.g., have the same state. When the RF generators 102 and 104 are not operated in reverse synchronization with each other, the angular tilt φ2 is large with respect to the vertical line 605. Density of ions of plasma within the plasma chamber 118 (FIG. 1A) increases at the central region of the substrate S and decreases at the edge region of the substrate S. Plasma sheath of the plasma is thick at the central region 129 and thin at the edge region 131 (FIG. 1A). Because of the greater density at the central region 129 compared to the edge region 131, the feature 712 is tilted at the angle φ2 with respect to the vertical line 605.

FIG. 7C is a diagram of an embodiment of a substrate 750, which is an example of the substrate S (FIGS. 1A and 1B), that is etched when the RF generators 102 and 104 are pulsed in reverse synchronization with each other during each cycle of the synchronization signal 162 (FIG. 1A) over multiple cycles of the synchronization signal 162. The substrate 750 includes the substrate layer 702 and the substrate stack layer 704 except that the substrate stack layer 704 includes features, such as a feature 708, that are etched within the substrate stack layer 704. The feature 708 is etched into the substrate stack layer 704 when the RF generators 102 and 104 are operated in reverse synchronization with each other. Because the RF generators 102 and 104 are operated in reverse synchronization reached each other, the feature 708 has a low angular tilt with respect to the vertical line 605 compared to the angular tilt of the feature 706 of FIG. 7A or compared to the feature 712 of FIG. 7B. During each cycle of the synchronization signal 162, if both the RF generators 102 and 104 are pulsed in reverse synchronization with respect to each other and duty cycles of the RF generators 102 and 104 are adjusted, an average angular tilt gradually diminishes over the time t.

Plasma within the plasma chamber 118 (FIG. 1A) becomes more uniform at the center and edge regions 129 and 131 over the time t.

In an embodiment, the terms center region and central region are used herein interchangeably.

FIG. 8 is an embodiment of a graph 800 to illustrate an ion angular distribution function. The graph 800 shows a distribution of ions of plasma within the plasma chamber 118 or 174 (FIGS. 1A and 1B) at angles measured with respect to the vertical line 605. As illustrated in the graph 800, the angular tilt is zero or substantially zero, such as within a range from 0 degrees to 0.03 degrees, for a large number, such as a majority, of ions of the plasma within the plasma chamber 118 or 174 and is not substantially zero for a small number of the ions. The iron angular distribution function illustrated in the graph 800 is achieved when the RF generators 102 and 104 are pulsed in a time division multiplexed manner, such as in reverse synchronization with each other.

Figure 9:
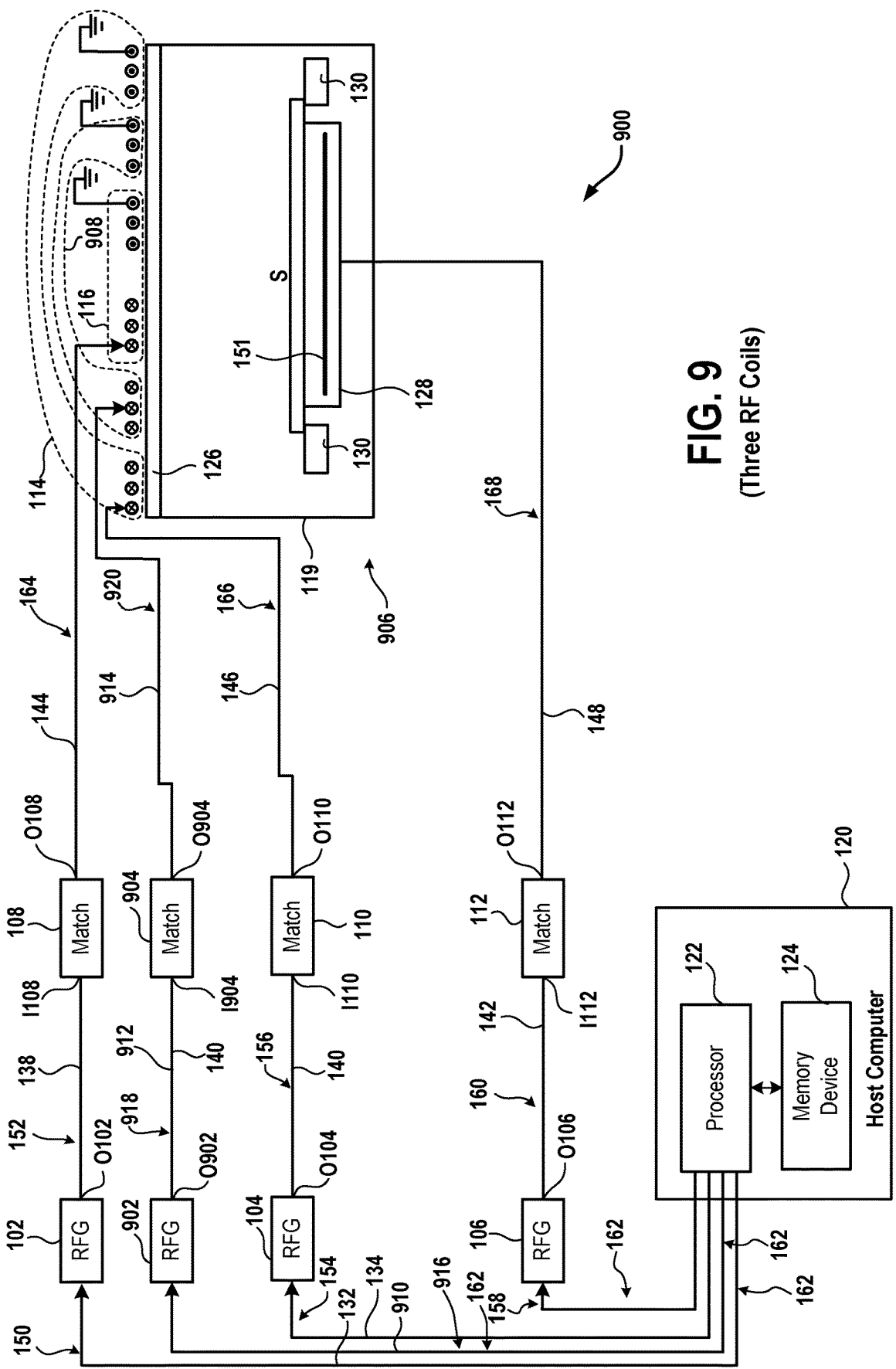
FIG. 9 is a diagram of an embodiment of a system to illustrate use of three RF coils that are operated in a multiplexed manner.

FIG. 9 is a diagram of an embodiment of a system 900 to illustrate use of three RF coils 114, 116 and 908 that are operated in a multiplexed manner. The system 900 is the same in structure and function as the system 100 of FIG. 1A except that the system 900 includes an RF generator 902, a match 904, and a plasma chamber 906. As an example, the RF generator 902 has a frequency of operation of that ranges from 10 kilohertz to 100 kHz.

In one embodiment, the RF generator 902 operates at substantially the same frequency as the RF generator 102, or the RF generator 104, or both the RF generators 102 and 104. For example, a frequency of operation of the RF generator 902 is within a predetermined range, such as within ±10%, from a frequency of operation of the RF generator 102. As another example, both the RF generators 102 and 902 has the same frequency of operation. As yet example, a frequency of operation of the RF generator 902 is within a predetermined range, such as within ±10%, from a frequency of operation of the RF generator 104. As another example, both the RF generators 104 and 902 has the same frequency of operation.

The plasma chamber 906 includes the RF coils 114 and 116, and further includes the substrate support 128 and the edge ring 130. The RF coil 908 is located above the dielectric window 126 of the plasma chamber 906. The RF coil 904 is located between the RF coils 114 and 116. For example, the RF coil 904 is located in the same horizontal plane as that of the RF coils 114 and 116. As another example, the RF coil 904 is located in a horizontal plane that above or below a horizontal plane in which the RF coils 114 and 116 are located. As yet another example, each RF coil 114, 116 and 904 is located in a different horizontal plane. As another example, the RF coil 908 is located above the substrate support 128 and no portion of the RF coil 908 is located above the edge ring 130. To illustrate, a vertical plane of the edge ring 130 does not overlap a vertical plane in which the RF coil 908 is located.

The processor 122 is coupled via a transfer cable 910 to the RF generator 902. An output O902 of the RF generator 902 is coupled via an RF cable 912 to an input 1904 of the match 904. An output O904 of the match 904 is coupled via an RF transmission line 914 to one end of the RF coil 908. An opposite end of the RF coil 908 is coupled to a ground potential.

The processor 122 generates a recipe signal 916. The recipe signal 916 includes recipe information, such as a parameter of an RF signal 918 to be generated by the RF generator 902 and a frequency of the RF signal 918. The recipe information of the recipe signal 916 further includes a duty cycle of the parameter of the RF signal 918. The processor 122 sends the recipe signal 916 via the transfer cable 910 to the RF generator 902. Upon receiving the recipe signal 916, the RF generator 902 stores the recipe information of the recipe signal 916 in one or more memory devices of the RF generator 902.

Also, the processor 122 sends the synchronization signal 162 via the transfer cable 910 to the RF generator 902. Upon receiving the synchronization signal 162, the RF generator 902 generates the RF signal 918 having the parameter and frequency received within the recipe signal 916. The frequency of the RF signal 918 is the same as the frequency of operation of the RF generator 902. The RF generator 902 sends the RF signal 918 via the output O902 and the RF cable 912 to the input 1904 of the match 904.

The match 904 matches an impedance of a load coupled to the output O904 with an impedance of a source coupled to the input 1904 to modify an impedance of the RF signal 918 to provide a modified RF signal 920 at the output O904. An example of the load coupled to the output O904 includes the RF transmission line 914 and the plasma chamber 906. An example of the source coupled to the input 1904 includes the RF generator 902 and the RF cable 912. The modified RF signal 920 is supplied from the output O904 via the RF transmission line 914 to the RF coil 908.

When the one or more process gases are supplied to the plasma chamber 906 in addition to supplying the modified RF signals 164, 920, 166, and 168, plasma is stricken or maintained within the plasma chamber 906 to process the substrate S on the top surface of the substrate support 128.

In one embodiment, the RF generator 902 has a different frequency of operation than that illustrated with respect to FIG. 9. For example, the RF generator 902 has a frequency of operation of 400 kHz or 2 MHz or 13.56 MHz or 27 MHz or 60 MHz.

In one embodiment, two of the RF coils 114, 116 and 904 are located next to but not above the side wall 119 of the plasma chamber 906. In this embodiment, a top portion of the sidewall 119 has a dielectric window and the dielectric window is integral with the dielectric window 126.

In one embodiment, the RF coil 908 is located above the edge ring 130 128 and no portion of the RF coil 908 is located above the substrate support 128. To illustrate, a vertical plane of the substrate support 128 does not overlap a vertical plane in which the RF coil 908 is located.

Figure 10A:
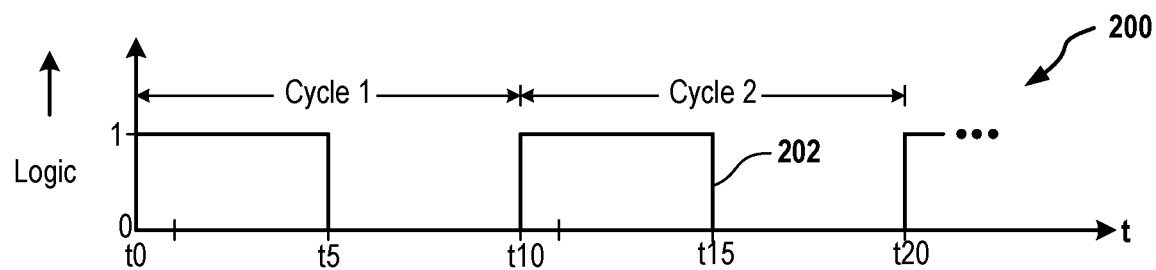
FIG. 10A is an embodiment of the graph of FIG. 2A to illustrate the synchronization signal.

FIG. 10A is an embodiment of the graph 200 to illustrate the synchronization signal 202.

Figure 10B:
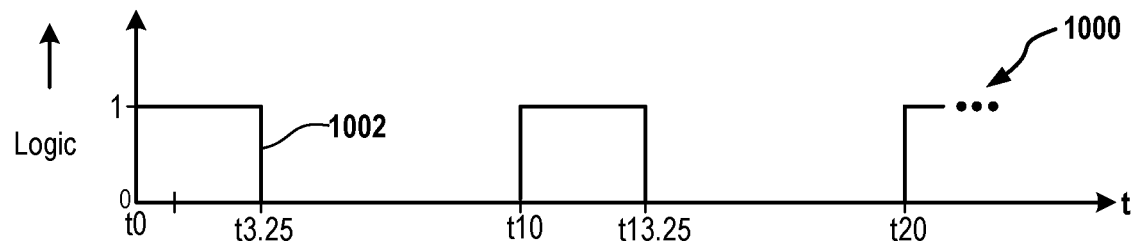
FIG. 10B is an embodiment of a graph to illustrate a digital pulsed signal for illustrating a duty cycle of a parameter of an RF signal generated an RF generator.

FIG. 10B is an embodiment of a graph 1000 to illustrate a digital pulsed signal 1002 for illustrating a duty cycle of the parameter of the RF signal 152 (FIG. 9) generated by the RF generator 102. The graph 1000 plots a logic level of the digital pulsed signal 1002 versus the time t. The logic level of the digital pulsed signal 1002 is plotted on a y-axis and the time t is plotted on an x-axis.

The digital pulsed signal 1002 has a duty cycle of 32.5%. For example, during the cycle 1 of the synchronization signal 202, the digital pulsed signal 1002 transitions at the time to from the logic level 0 to the logic level 1 and remains at the logic level 1 from the time to to a time t3.25, which lies at a quarter of a time period between the times t3 and t4. Also, during the cycle 1 of the synchronization signal 202, the digital pulsed signal 1002 transitions from the logic level 1 to the logic level 0 at the time t3.5 and stays at the logic level 0 from the time t3.25 to the time t10. Moreover, during the cycle 2 of the synchronization signal 202, the digital pulsed signal 1002 transitions at the time t10 from the logic level 0 to the logic level 1 and remains at the logic level 1 from the time t10 to a time t13.25, which lies at a quarter of a time period between the times t13 and t14. During the cycle 2 of the synchronization signal 202, the digital pulsed signal 1002 transitions from the logic level 1 to the logic level 0 at the time t13.25 and stays at the logic level 0 from the time t13.25 to the time t20. As such, during each cycle of the synchronization signal 202, the digital pulsed signal 1002 has the logic level 1 for a time period that occupies 32.5% of the cycle and has the logic level 0 for a remaining time period that occupies 67.5% of the cycle.

Figure 10C:
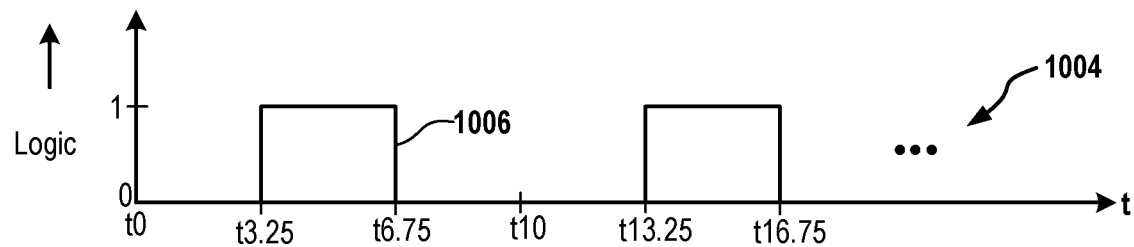
FIG. 10C is an embodiment of a graph to illustrate a digital pulsed signal for illustrating a duty cycle of a parameter of an RF signal generated an RF generator.

FIG. 10C is an embodiment of a graph 1004 to illustrate a digital pulsed signal 1006 for illustrating a duty cycle of the parameter of the RF signal 156 generated by the RF generator 104. The graph 1004 plots a logic level of the digital pulsed signal 1006 versus the time t. The logic level of the digital pulsed signal 1006 is plotted on a y-axis and the time t is plotted on an x-axis.

The digital pulsed signal 1006 has a duty cycle of 35% and is reversely synchronized with respect to the digital pulsed signal 1002 (FIG. 10B) during a portion of each cycle of the synchronization signal 202. For example, during the cycle 1 of the synchronization signal 202, the digital pulsed signal 1006 is at the logic level 0 at the time to, remains at the logic level 0 until the time t3.25, transitions from the logic level 0 to the logic level 1 at the time t3.25, and remains at the logic level 1 from the time t3.25 to a time t6.75, which occurs at three quarters of a time period between the times t6 and t7. Also, during the cycle 1 of the synchronization signal 202, the digital pulsed signal 1006 transitions from the logic level 1 to the logic level 0 at the time t6.75 and stays at the logic level 0 from the time t6.75 to the time t10.

Moreover, during the cycle 2 of the synchronization signal 202, the digital pulsed signal 1006 is at the logic level 0 at the time t10, remains at the logic level 0 until the time t13.25, and transitions at the time t13.25 from the logic level 0 to the logic level 1. During the cycle 2 of the synchronization signal 202, the digital pulsed signal 1006, the digital pulsed signal 1006 remains at the logic level 1 from the time t13.25 to a time t16.75, which occurs at three quarters of a time period between the times t16 and t17. During the cycle 2 of the synchronization signal 202, the digital pulsed signal 1006 transitions from the logic level 1 to the logic level 0 at the time t16.75 and stays at the logic level 0 from the time t16.75 to the time t20. As such, during each cycle of the synchronization signal 202, the digital pulsed signal 1006 has the logic level 1 for a time period that occupies 35% of the cycle and has the logic level 0 for a remaining time period that occupies 65% of the cycle.

Also, during a portion of each cycle of the synchronization signal 202, the digital pulsed signal 1006 has an opposite logic level compared to a logic level of the digital pulsed signal 1002 to be reversely synchronized with the digital pulsed signal 1002 and during the remaining portion of the cycle of the synchronization signal 202, the digital pulsed signal 1006 has the same logic level as that of the digital pulsed signal 1002. For example, during a time period between the times t0 and t6.75, the digital pulsed signals 1002 and 1006 are reversely synchronized with respect to each other and during a time period between the times t6.75 and t10, the digital pulsed signals 1002 and 1006 are not reversely synchronized with respect to each other.

Figure 10D:
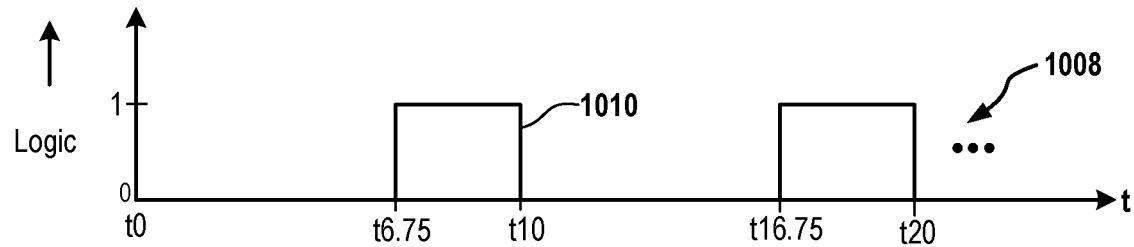
FIG. 10D is an embodiment of a graph to illustrate a digital pulsed signal for illustrating a duty cycle of a parameter of an RF signal generated an RF generator.

FIG. 10D is an embodiment of a graph 1008 to illustrate a digital pulsed signal 1010 for illustrating a duty cycle of the parameter of the RF signal 918 (FIG. 9) generated by the RF generator 902. The graph 1008 plots a logic level of the digital pulsed signal 1010 versus the time t. The logic level of the digital pulsed signal 1010 is plotted on a y-axis and the time t is plotted on an x-axis.

The digital pulsed signal 1010 has a duty cycle of 32.5%, and is reversely synchronized with respect to the digital pulsed signal 1002 (FIG. 10B) and with respect to the digital pulsed signal 1006 (FIG. 10C) during a portion of each cycle of the synchronization signal 202. For example, during the cycle 1 of the synchronization signal 202, the digital pulsed signal 1010 transitions from the logic level 1 to the logic level 0 at the time to, remains at the logic level 0 from the time t0 to the time t6.75. During the cycle 1 of the synchronization signal 202, the digital pulsed signal 1010 transitions from the logic level 0 to the logic level 1 at the time t6.75, and remains at the logic level 1 from the time t6.75 to the time t10. Moreover, during the cycle 2 of the synchronization signal 202, the digital pulsed signal 1010 transitions at the time t10 from the logic level 1 to the logic level 0 and remains at the logic level 0 from the time t10 to the time t16.75. During the cycle 2 of the synchronization signal 202, the digital pulsed signal 1010 transitions from the logic level 0 to the logic level 1 at the time t16.75 and stays at the logic level 1 from the time t16.75 to the time t20. As such, during each cycle of the synchronization signal 202, the digital pulsed signal 1010 has the logic level 1 for a time period that occupies 32.5% of the cycle and has the logic level 0 for a remaining time period that occupies 67.5% of the cycle.

Also, during a portion of each cycle of the synchronization signal 202, the digital pulsed signal 1010 has an opposite logic level compared to a logic level of the digital pulsed signal 1002 to be reversely synchronized with the digital pulsed signal 1002 and during the remaining portion of the cycle of the synchronization signal 202, the digital pulsed signal 1010 has the same logic level as that of the digital pulsed signal 1002. For example, during a time period between the times t0 and t3.25 and between the times t6.75 and t10, the digital pulsed signals 1002 and 1010 are reversely synchronized with respect to each other and during a time period between the times t3.25 and t6.75, the digital pulsed signals 1002 and 1010 are not reversely synchronized with respect to each other.

Similarly, during a portion of each cycle of the synchronization signal 202, the digital pulsed signal 1010 has an opposite logic level compared to a logic level of the digital pulsed signal 1006 to be reversely synchronized with the digital pulsed signal 1006 and during the remaining portion of the cycle of the synchronization signal 202, the digital pulsed signal 1010 has the same logic level as that of the digital pulsed signal 1006. For example, during a time period between the times t3.25 and t10, the digital pulsed signals 1006 and 1010 are reversely synchronized with respect to each other and during a time period between the times to and t3.25, the digital pulsed signals 1006 and 1010 are not reversely synchronized with respect to each other.

Figure 10E:
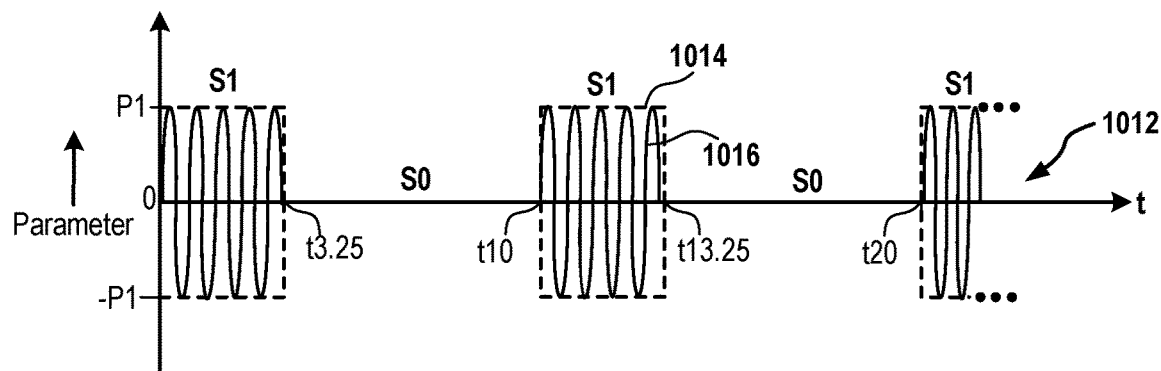
FIG. 10E is an embodiment of a graph to illustrate a parameter of an RF signal.

FIG. 10E is an embodiment of a graph 1012 to illustrate a parameter 1014 of an RF signal 1016. The RF signal 1016 is an example of the RF signal 152 generated by the RF generator 102 (FIG. 9). The graph 1012 plots the parameter 1014 on a y-axis and plots the time t on an x-axis. As an example, the parameter 1014 is an envelope of the RF signal 1016.

The parameter 1014 of the RF signal 1016 is synchronized with the duty cycle of the digital pulsed signal 1002 (FIG. 10B). For example, during the cycle 1 of the synchronization signal 202 (FIG. 10A), the parameter 1014 transitions at the time to from a parameter level of zero to the parameter levels P1 and –P1. During the cycle 1 of the synchronization signal 202, the parameter 1014 remains at the parameter levels P1 and −P1 from the time t0 to the time t3.25 and transitions at the time t3.25 from the parameter levels P1 and −P1 to the parameter level 0. Also, during the cycle 1 of the synchronization signal 202, the parameter 1014 remains at the parameter level 0 from the time t3.25 to the time t10. Similarly, during the cycle 2 of the synchronization signal 202 (FIG. 10A), the parameter 1014 transitions at the time t10 from the parameter level of zero to the parameter levels P1 and −P1. During the cycle 2 of the synchronization signal 202, the parameter 1014 remains at the parameter levels P1 and −P1 from the time t10 to the time t13.25 and transitions at the time t13.25 from the parameter levels P1 and −P1 to the parameter level 0. Also, during the cycle 2 of the synchronization signal 202, the parameter 1014 remains at the parameter level 0 from the time t13.25 to the time t20.

It should be noted that the parameter levels P1 and −P1 define a state S1 of the RF signal 1016 and the parameter level of zero defines a state S0 of the RF signal 1016.

It should further be noted that the parameter level P1 includes multiple positive values of power or voltage of the RF signal 1016 and the parameter level −P1 includes multiple negative values of power or voltage of the RF signal 1016. Also, in one embodiment, the parameter level of zero includes multiple values of power or voltage of the RF signal 1016. To illustrate, the parameter level of zero is substantially zero.

In one embodiment, instead of transitioning at the times t3.25 and t13.25 to the parameter level zero, the parameter 1016 transitions at the times t3.25 and t13.25 to a positive parameter level greater than zero. For example, the parameter 1014 transitions at each time t3.25 and t13.25 from the parameter level P1 to a positive parameter level between zero and P1 and from the parameter level −P1 to a negative parameter level between zero and −P1. The parameter 1014 transitions each time t10 and t20 from the positive parameter level to the parameter level P1 and from the negative parameter level to the parameter level −P1. The parameter levels P1 and −P1 define the state S1 of the RF signal 1016 and the positive and negative parameter levels define the state S0 of the RF signal 1016.

In an embodiment, the parameter 1014 transitions from the state S1 to the state S0 during a time period, such as a time interval between the time t3.25 and the time t3.5 or time interval between the time t3.25 and the time t4, instead of transitioning at the time t3.25. Similarly, instead of the parameter 1014 transitioning from the state S0 to the state S1 at a time, the parameter 1014 transitions from the state S0 to the state S1 during a time period or time interval.

Figure 10F:
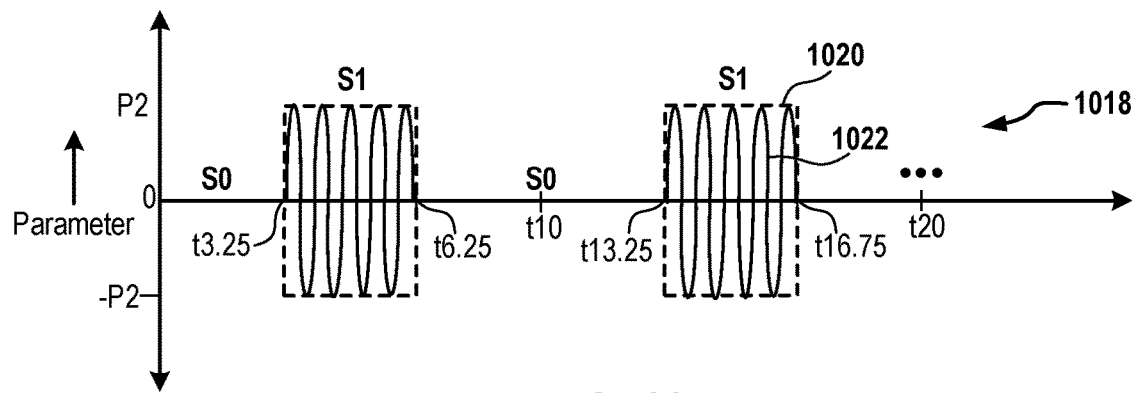
FIG. 10F is an embodiment of a graph to illustrate a parameter of an RF signal.

FIG. 10F is an embodiment of a graph 1018 to illustrate a parameter 1020 of an RF signal 1022. The RF signal 1022 is an example of the RF signal 156 generated by the RF generator 104 (FIG. 9). The graph 1018 plots the parameter 1020 on a y-axis and plots the time t on an x-axis. The parameter 1020 is an envelope of the RF signal 1022.

The parameter 1020 of the RF signal 1022 is synchronized with the duty cycle of the digital pulsed signal 1006 (FIG. 10C). For example, during the cycle 1 of the synchronization signal 202 (FIG. 3A), the parameter 1020 has a parameter level of zero at the time t0, remains at the parameter level zero from the time t0 to the time t3.25, transitions at the time t3.25 from the parameter level of zero to the set of parameter levels P2 and −P2. During the cycle 1 of the synchronization signal 202, the parameter 1020 remains at the parameter levels P2 and −P2 from the time t3.25 to the time t6.75 and transitions at the time t6.75 from the parameter levels P2 and −P2 to the parameter level of zero. Also, during the cycle 1 of the synchronization signal 202, the parameter 1020 remains at the parameter level of zero from the time t6.75 to the time t10. Similarly, during the cycle 2 of the synchronization signal 202 (FIG. 10A), the parameter 1020 is at the parameter level of zero at the time t10 and remains at the parameter level of zero from the time t10 to the time t13.25. During the cycle 2 of the synchronization signal 202, the parameter 1020 transitions at the time t13.25 from the parameter level of zero to the parameter levels P2 and −P2. Also, during the cycle 2 of the synchronization signal 202, the parameter 1020 remains at the parameter levels P2 and −P2 from the time t13.25 to the time t16.75. Further, during the cycle 2 of the synchronization signal 202, the parameter 1020 transitions from the parameter levels P2 and −P2 to the parameter level of zero at the time t16.75 and remains at the parameter level of zero from the time t16.75 to the time t20.

It should be noted that the parameter level of zero defines a state S0 of the RF signal 1022 and the parameter levels P2 and −P2 defines a state S1 of the RF signal 1022. It should further be noted that the parameter level P2 includes multiple positive values of power or voltage of the RF signal 1022 and the parameter level −P2 includes multiple negative values of power or voltage of the RF signal 1022. Also, in an embodiment, the parameter level of zero includes multiple values of power or voltage of the RF signal 1022. To illustrate, the parameter level of zero of the parameter 1020 of the RF signal 1022 is substantially zero.

Also, during a portion of each cycle of the synchronization signal 202, the parameter 1020 has an opposite state compared to a state of the parameter 1014 to be reversely synchronized with the parameter 1014 and during the remaining portion of the cycle of the synchronization signal 202, the parameter 1020 has the same state as that of the parameter 1014. For example, during a time period between the times t0 and t6.75, the parameters 1020 and 1014 are reversely synchronized with respect to each other and during a time period between the times t6.75 and t10, the parameters 1020 and 1014 are not reversely synchronized with respect to each other.

In one embodiment, instead of transitioning at the times t6.75 and t16.75 from the parameter levels P2 and −P2 to the parameter level of zero, the parameter 1020 transitions at the times t6.75 and t16.75 to a positive parameter level greater than zero. For example, the parameter 1020 transitions at each time t6.75 and t16.75 from the parameter level P2 to a positive parameter level between zero and P2 and from the parameter level −P2 to a negative parameter level between zero and −P2. The parameter 1020 transitions each time t3.25 and t13.25 from the positive parameter level to the parameter level P2 and from the negative parameter level to the parameter level −P2. The parameter levels P2 and −P2 define the state S1 of the RF signal 1022 and the positive and negative parameter levels define the state S0 of the RF signal 1022.

In an embodiment, the parameter 1020 transitions from the state S0 to the state S1 during a time period, such as a time interval between the time t3.25 and the time t4 or time interval between the time t3.25 and a time t3.75, instead of transitioning at the time t3.25. The time t3.75 lies at three quarters of the time period between the times t3 and t4. Similarly, instead of the parameter 1020 transitioning from the state S1 to the state S0 at a time, the parameter 1020 transitions from the state S1 to the state S0 during a time period or time interval.

Figure 10G:
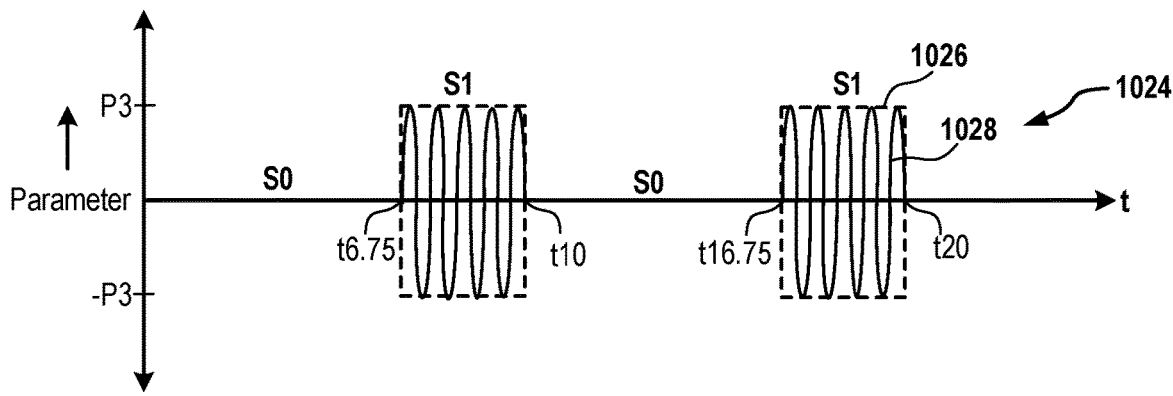
FIG. 10G is an embodiment of a graph to illustrate a parameter of an RF signal.

FIG. 10G is an embodiment of a graph 1024 to illustrate a parameter 1026 of an RF signal 1028. The RF signal 1028 is an example of the RF signal 918 generated by the RF generator 902 (FIG. 9). The graph 1024 plots the parameter 1026 on a y-axis and plots the time t on an x-axis. The parameter 1026 is an envelope of the RF signal 1028.

The parameter 1026 of the RF signal 1028 is synchronized with the duty cycle of the digital pulsed signal 1010 (FIG. 10D). For example, during the cycle 1 of the synchronization signal 202 (FIG. 10A), the parameter 1026 transitions from a set of parameter levels P3 and −P3 to a parameter level of zero at the time to, remains at the parameter level zero from the time t0 to the time t6.75, and transitions at the time t6.75 from the parameter level of zero to the set of parameter levels P3 and −P3. During the cycle 1 of the synchronization signal 202, the parameter 1026 remains at the parameter levels P3 and −P3 from the time t6.75 to the time t10. Similarly, during the cycle 2 of the synchronization signal 202 (FIG. 10A), the parameter 1026 transitions from the parameter levels P3 and −P3 to the parameter level zero at the time t10 and remains at the parameter level of zero from the time t10 to the time t16.75. During the cycle 2 of the synchronization signal 202, the parameter 1026 transitions at the time t16.75 from the parameter level zero to the parameter levels P3 and −P3. Also, during the cycle 2 of the synchronization signal 202, the parameter 1026 remains at the parameter levels P3 and −P3 from the time t16.75 to the time t20.

It should be noted that the parameter level of zero defines a state S0 of the RF signal 1028 and the parameter levels P3 and −P3 defines a state S1 of the RF signal 1028. It should further be noted that the parameter level P3 includes multiple positive values of power or voltage of the RF signal 1028 and the parameter level −P3 includes multiple negative values of power or voltage of the RF signal 1028. Also, in one embodiment, the parameter level of zero includes multiple values of power or voltage of the RF signal 1028. To illustrate, the parameter level of zero of the parameter 1026 of the RF signal 1028 is substantially zero.

During a portion of each cycle of the synchronization signal 202, the parameter 1026 has an opposite state compared to a state of the parameter 1014 to be reversely synchronized with the parameter 1014 and during the remaining portion of the cycle of the synchronization signal 202, the parameter 1026 has the same state as that of the parameter 1014. For example, during a time period between the times t0 and t3.25 and during a time period between the times t6.75 and t10, the parameters 1014 and 1026 are reversely synchronized with respect to each other. During a time period between the times t3.25 and t6.75, the parameters 1014 and 1026 are not reversely synchronized with respect to each other.

Similarly, during a portion of each cycle of the synchronization signal 202, the parameter 1026 has an opposite state compared to a state of the parameter 1020 to be reversely synchronized with the parameter 1020 and during the remaining portion of the cycle of the synchronization signal 202, the parameter 1026 has the same state as that of the parameter 1020. For example, during a time period between the times t3.25 and t10, the parameters 1020 and 1026 are reversely synchronized with respect to each other and during a time period between the times t0 and t3.25, the parameters 1020 and 1026 are not reversely synchronized with respect to each other.

In one embodiment, instead of transitioning at the times to and t10 from the parameter levels P3 and −P3 to the parameter level of zero, the parameter 1026 transitions at the times t0 and t10 to a positive parameter level greater than zero. For example, the parameter 1026 transitions at each time t0 and t10 from the parameter level P3 to a positive parameter level between zero and P3 and from the parameter level −P3 to a negative parameter level between zero and −P3. The parameter 1026 transitions each time t6.75 and t16.75 from the positive parameter level to the parameter level P3 and from the negative parameter level to the parameter level −P3. The parameter levels P3 and −P3 define the state S1 of the RF signal 1028 and the positive and negative parameter levels define the state S0 of the RF signal 1028. It should be noted that one or more values of the positive parameter level are exclusive from one or more values of the parameter level P3 and one or more values of the negative parameter level are exclusive from one or more values of the parameter level −P3. For example, a minimum of the one or more values of the parameter level P3 is greater than a maximum of the one or more values of the positive parameter level and a minimum of one or more values of the negative parameter level is greater than a maximum of one or more values of the parameter level −P3.

In an embodiment, the parameter 1026 transitions from the state S0 to the state S1 during a time period, such as a time interval between the time t6.75 and a time t7.5 or time interval between the time t6.75 and the time t7, instead of transitioning at the time t6.75. The time t7.5 is located at half of a time period between the times t7 and t8. Similarly, instead of the parameter transitioning from the state S1 to the state S0 at a time, the parameter 1026 transitions from the state S1 to the state S0 during a time period or time interval.

In one embodiment, the parameter level P3 is the same as the parameter level P2 or the parameter level P1. In an embodiment, the parameter level P3 is greater than the parameter levels P1 and P2, and the parameter level −P3 is lower than the parameter levels −P1 and −P2. In one embodiment, the parameter level P3 is less than the parameter levels P1 and P2, and the parameter level −P3 is greater than the parameter levels −P1 and −P2.

In an embodiment, the parameter level P3 is between the parameter levels P1 and P2, and the parameter level −P3 is between the parameter levels −P1 and −P2. For example, the parameter level P3 is greater than the parameter level P1 and less than the parameter level P2. Also, the parameter level −P3 is greater than the parameter level −P1 and lower than the parameter level −P2. As another example, the parameter level P3 is greater than the parameter level P2 and less than the parameter level P1. Also, the parameter level −P3 is greater than the parameter level −P2 and lower than the parameter level −P1.

In an embodiment, the parameters 1014, 1020, and 1026 pulse for more than one time during each cycle of the synchronization signal 202, and the parameters 1014, 1020, and 1026 pulse in a time division multiplex manner.

Figure 11:
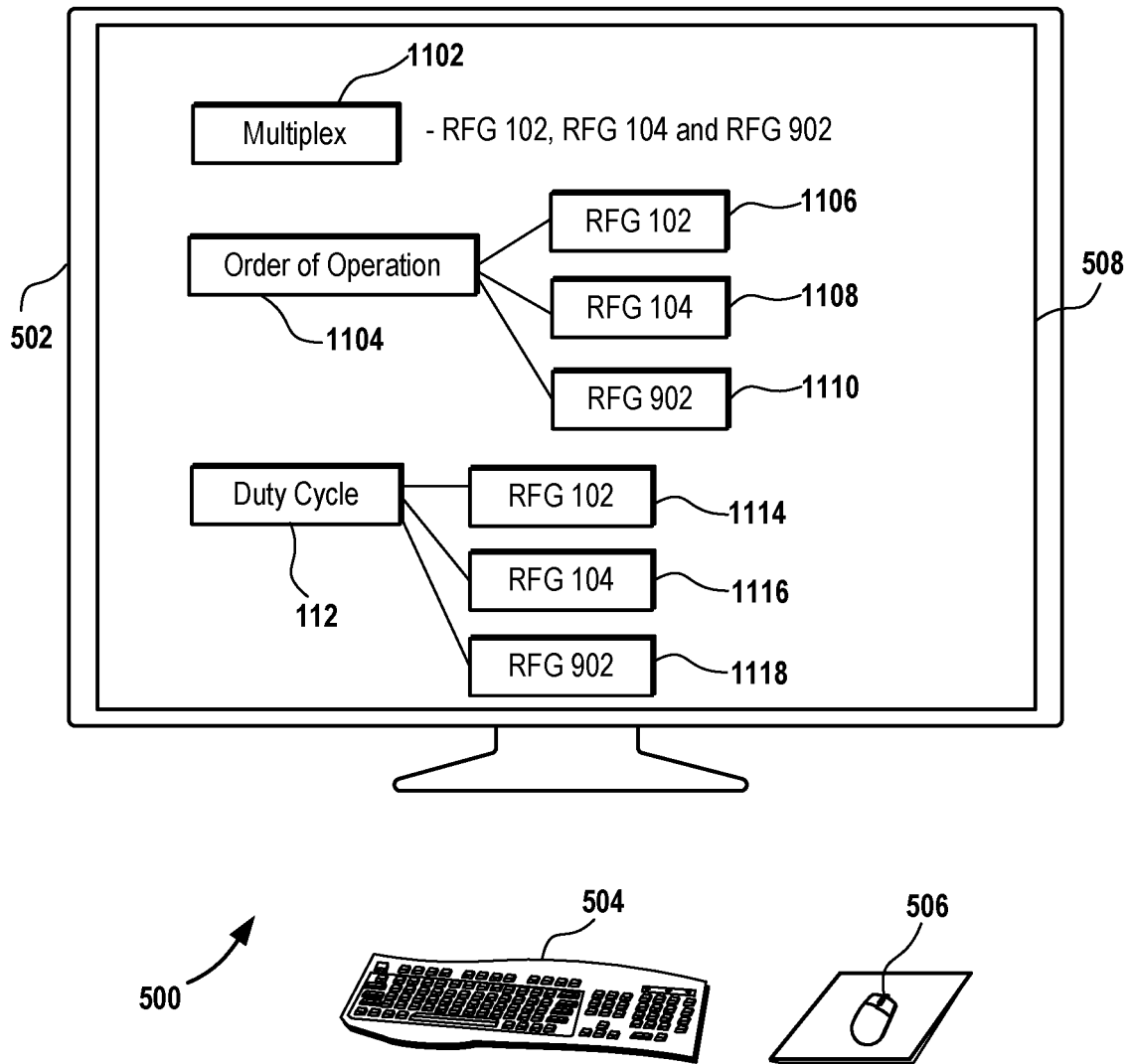
FIG. 11 is a diagram of a computer system to illustrate a user interface for illustrating a control of multiplexing operation of three RF generators.

FIG. 11 is a diagram of the computer system 500 to illustrate a user interface for illustrating a control of multiplexing operation of the RF generators 102, 104, and 902 (FIG. 9). During operation, the CPU and the GPU controls the display screen 508 to display a graphical button 1102 to select a multiplexing operation for time division multiplexing of the RF signals 152, 156, and 918 (FIG. 9). For example, in response to receiving a selection from a user via the keyboard 504 or the optical mouse 506 of the graphical button 1102, the CPU generates the duty cycles illustrated in FIG. 10B-10D for sending to the corresponding RF generators 102, 104, and 902.

The duty cycle of operation of the RF generator 104 is multiplexed with respect to the duty cycle of operation of the RF generator 102 and the duty cycle of operation of the RF generator 902. It should be noted that the duty cycle of operation of the RF generator 102 is the same as the duty cycle of the RF signal 152 generated by the RF generator 102, the duty cycle of operation of the RF generator 902 is the same as the duty cycle of the RF signal 918 generated by the RF generator 902, and the duty cycle of operation of the RF generator 104 is the same as the duty cycle of the RF signal 156 generated by the RF generator 104.

Also, the CPU and the GPU controls the display screen 508 to display a graphical button 1104 to receive a selection regarding whether one or two of the RF generators 102, 104, and 902 are to start with their respective state S1 at the time t0. For example, in response to receiving a selection of a graphical button 1106, the CPU determines to control the RF generator 102 to start at the state S1 at the time to. As another example, in response to receiving a selection of a graphical button 1108, the CPU determines to control the RF generator 104 to start at the state S1 at the time t0. As yet another example, in response to receiving a selection of a graphical button 1110, the CPU determines to control the RF generator 902 to start at the state S1 at the time to. When any of the graphical button 1106-1110 is not selected, the CPU determines to control the respective RF generator 102, 104, or 902 to start operating at the state S0 at the time t0. This selection regarding whether the RF generator 102 or 104 or 902 is to start with the state S1 at the time to is received from the user via the keyboard 504 or the optical mouse 506.

The CPU and the GPU also controls the display screen 508 to display multiple graphical buttons 1112, 1114, 1116, and 1118 to receive a duty cycle of two or more of the RF generators 102, 104, and 902. For example, when a selection of the graphical buttons 1112 and 1114 is received from the user via the keyboard 504 or the optical mouse 506, the CPU allows a selection of a duty cycle, such as, 25% or 35% or 45% or 28%, of operation of the RF generator 102. Similarly, as another example, when a selection of the graphical buttons 1112 and 1116 is received from the user via the keyboard 504 or the optical mouse 506, the CPU allows a selection of a duty cycle, such as, 25% or 35% or 45% or 28%, of operation of the RF generator 104. Also, when a selection of the graphical buttons 1112 and 1118 is received from the user via the keyboard 504 or the optical mouse 506, the CPU allows a selection of a duty cycle, such as, 25% or 35% or 45% or 28%, of operation of the RF generator 902.

It should be noted that in response to receiving a selection of the graphical buttons 1102, and 1104 and 1106, and 1112 and 1114, the recipe signal 150 (FIG. 9) is generated. Similarly, in response to receiving a selection of the graphical buttons 1102, and 1104 and 1108, and 1112 and 1116, the recipe signal 154 (FIG. 9) is generated. Also, in response to receiving a selection of the graphical buttons 1102, and 1104 and 1110, and 1112 and 1118, the recipe signal 916 (FIG. 9) is generated. For example, the recipe signal 916 includes a duty cycle of the RF generator 902 for generating the RF signal 912.

Also, the recipe signal 916 includes an instruction from the processor 122 (FIG. 1A) to the RF generator 902 to operate in a time-division multiplexed manner with operations of the RF generators 102 and 104. For example, the recipe signal 916 includes an instruction from the processor 122 (FIG. 1A) to the RF generator 902 to operate in reverse synchronization with an operation of the RF generator 102 for a portion of each cycle of the synchronization signal 162 (FIG. 9) and not operate in reverse synchronization for the remaining portion of each cycle of the synchronization signal 162. Also, in the example, the recipe signal 916 includes an instruction from the processor 122 (FIG. 1A) to the RF generator 902 to operate in reverse synchronization with an operation of the RF generator 104 for a portion of each cycle of the synchronization signal 162 (FIG. 9) and not operate in reverse synchronization for the remaining portion of each cycle of the synchronization signal 162.

In one embodiment, a state of an RF generator is the same as a state of an RF signal generated by the RF generator. For example, both the RF generator 102 and the RF signal 152 generated by the RF generator 102 have the state S1 during a time period of the synchronization signal 162 or have the state S0 during the remaining time period of the synchronization signal 162.

Figure 12:
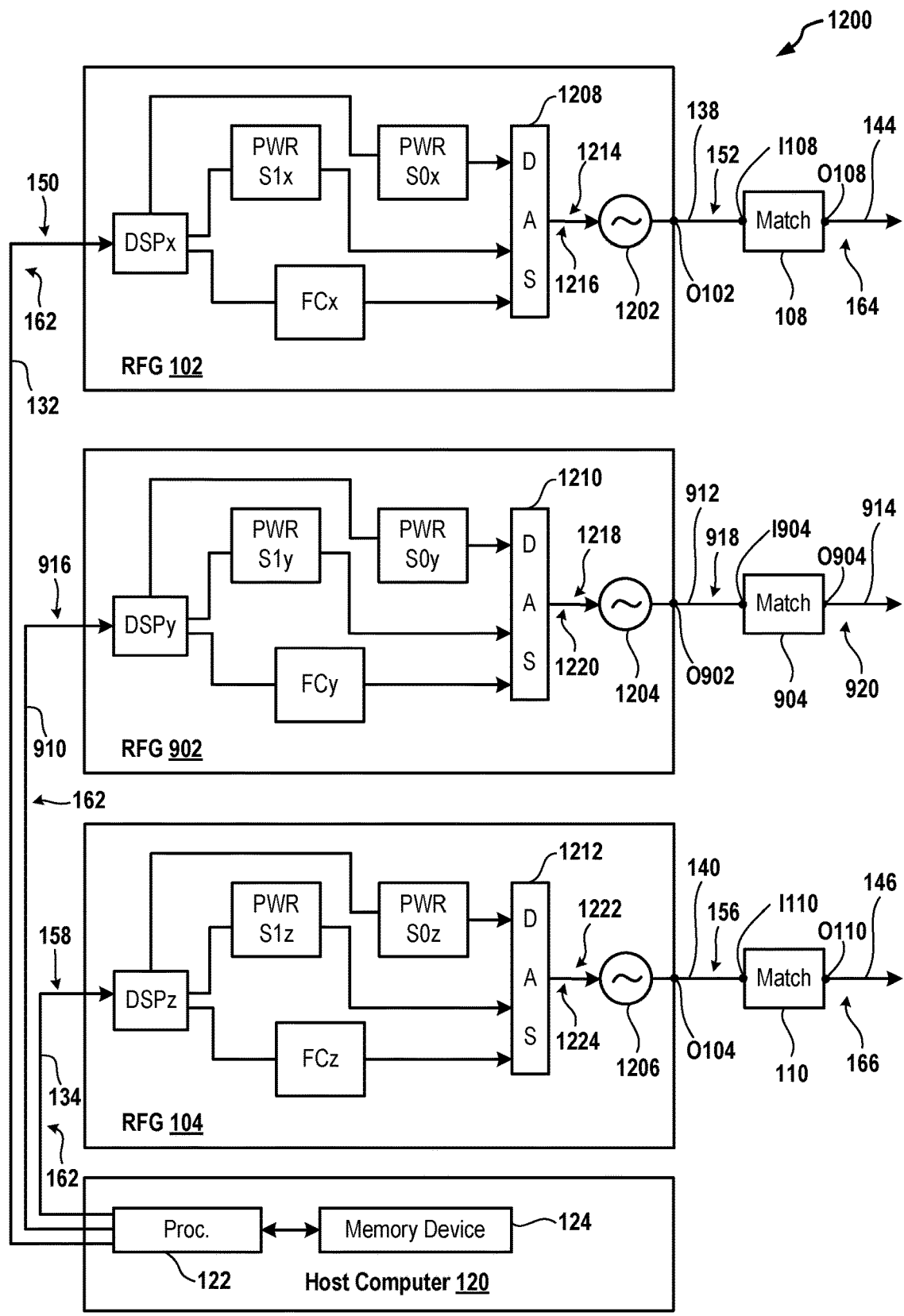
FIG. 12 is a diagram of an embodiment of a system to illustrate internal components of the three RF generators.

FIG. 12 is a diagram of an embodiment of a system 1200 to illustrate internal components of the RF generators 102, 104, and 902. The system 1200 includes the RF generators 102, 104, and 902, and further includes the match 108, the match 904, and the match 110.

The RF generator 102 includes a digital signal processor (DSP) DSPx, a parameter controller PWRS1x, a parameter controller PWRS0x, and a frequency controller FCx. The RF generator 102 includes a driver and amplifier system (DAS) 1208. The RF generator 102 further includes an RF power supply 1202. An example of an RF power supply, described herein, includes an electronic oscillator that produces an oscillating signal having a radio frequency. Examples of a digital signal processor, as used herein, include a microcontroller and a microprocessor chip. To illustrate, the digital signal processor includes one or more memory caches for storing recipe information described herein. Also, as an example, a controller, as used herein, includes a processor and one or more memory devices. The processor of the controller is coupled to the memory device of the controller.

A driver and amplifier system includes one or more drivers and an amplifier. One or more drivers are coupled to the amplifier. An example of a driver includes one or more transistors.

The processor 122 is coupled via the transfer cable 132 to the digital signal processor DSPx, which is coupled to the controllers PWRS1x, PWRS0x, and FCx. The controllers PWRS1x, PWRS0x, and FCx are coupled to the DAS 1208, which is coupled to the RF power supply 1202. The RF power supply 1202 is coupled via the RF cable 138 to the input 1108 of the match 108.

Similarly, the RF generator 902 includes a digital signal processor DSPy, a parameter controller PWRS1y, a parameter controller PWRS0y, and a frequency controller FCy. The RF generator 902 includes a DAS 1210. The RF generator 902 further includes an RF power supply 1204. The processor 122 is coupled via the transfer cable 910 to the digital signal processor DSPy, which is coupled to the controllers PWRS1y, PWRS0y, and FCy. The controllers PWRS1y, PWRS0y, and FCy are coupled to the DAS 1210, which is coupled to the RF power supply 1204. The RF power supply 1204 is coupled via the RF cable 912 to the input 1904 of the match 904.

Also, the RF generator 104 includes a digital signal processor DSPz, a parameter controller PWRS1z, a parameter controller PWRS0z, and a frequency controller FCz. The RF generator 104 includes a DAS 1212. The RF generator 104 further includes an RF power supply 1206. The processor 122 is coupled via the transfer cable 134 to the digital signal processor DSPz, which is coupled to the controllers PWRS1z, PWRS0z, and FCz. The controllers PWRS1z, PWRS0z, and FCz are coupled to the DAS 1212, which is coupled to the RF power supply 1206. The RF power supply 1206 is coupled via the RF cable 140 to the input 1110 of the match 110.

In operation, the digital signal processor DSPx receives the recipe signal 150 via the transfer cable 132 from the processor 122, and identifies from the recipe signal 150, recipe information to be sent to the parameter controller PWRS1x, recipe information to be sent to the parameter controller PWRS0x, and recipe information to be sent to the frequency controller FCx. For example, the digital signal processor DSPx identifies from the recipe signal 150 that a parameter level for the state S1 of the RF signal 152 to be generated by the RF power supply 1202 is to be sent to the parameter controller PWRS1x. The digital signal processor DSPx further identifies from the recipe signal 150 that a parameter level for the state S0 of the RF signal 152 to be generated by the RF power supply 1202 is to be sent to the parameter controller PWRS0x. Also, the digital signal processor DSPx identifies from the recipe signal 150 that a frequency level for the states S0 and S1 of the parameter of the RF signal 152 is to be sent to the frequency controller FCx. As an example, a frequency level of an RF signal includes one or more frequency values of the RF signal. The one or more frequency values of the frequency level are within a predetermined range, such as within ±5%, from each other.

Also, in the example, the digital signal processor DSPx identifies from the recipe signal 150 that the duty cycle for the state S1 of the parameter of the RF signal 152 and identifications of time intervals for splitting the duty cycle between a number of the time intervals during a cycle of the synchronization signal 162 are to be sent to the parameter controller PWRS1x. To illustrate, the digital signal processor DSPx identifies from the recipe signal 150 that the duty cycle of the parameter 410 (FIG. 4D) is to be split between a first time interval between the times t0 and t2 and a second time interval between the times t5 and t7.5, as illustrated in FIG. 4D.

Continuing further with the example, the digital signal processor DSPx sends the recipe information identified within the recipe signal 152 for the parameter controller PWRS1x to the parameter controller PWRS1x. The parameter controller PWRS1x stores the recipe information received from the digital signal processor DSPx in one or more memory devices of the parameter controller PWRS1x. Also, in the example, the digital signal processor DSPx sends the recipe information identified within the recipe signal 152 for the parameter controller PWRS0x to the parameter controller PWRS0x. The parameter controller PWRS0x stores the recipe information received from the digital signal processor DSPx in one or more memory devices of the parameter controller PWRS0x. Further, in the example, the digital signal processor DSPx sends the recipe information identified within the recipe signal 152 for the frequency controller FCx to the frequency controller FCx. The frequency controller FCx stores the recipe information received from the digital signal processor DSPx in one or more memory devices of the frequency controller FCx.

Upon receiving the synchronization signal 162 from the processor 122 via the transfer cable 132, the digital signal processor DSPx sends the synchronization signal 162 to the controllers PWRS1x, PWRS0x, and FCx. In response to receiving the synchronization signal 162, the parameter controller PWRS1x generates and sends an instruction including the parameter level of the state S1 of the RF signal 152 and the duty cycle of the state S1 to the DAS 1208 for each cycle of the synchronization signal 162. Also, in response to the reception of the synchronization signal 162, the frequency controller FCx generates and sends an instruction including the frequency level of the RF signal 152 for each cycle of the synchronization signal 162 to the DAS 1208.

When the instructions are received from the parameter controller PWRS1x and the frequency controller FCx, the DAS 1208 generates a current signal 1214 based on the parameter level for the state S1 of the RF signal 152 and based on the frequency level received from the frequency controller FCx for one or more time periods of the duty cycle of the state S1, and sends the current signal 1214 to the RF power supply 1202. The one or more time periods of the duty cycle of the state S1 of the RF signal 152 occur during the one or more time periods of each cycle of the synchronization signal 162. During the one or more time periods of the duty cycle of the state S1 of the RF signal 152 for which the current signal 1214 is received, the RF power supply 1202 generates the RF signal 152 having the parameter level of the state S1 of the RF signal 152 and the frequency level of the RF signal 152.

It should be noted that the DAS 1208 does not generate the current signal 1214 for a remaining time period during each cycle of the synchronization signal 162. The remaining time period during each cycle of the synchronization signal 162 corresponds to the state S0 of the parameter of the RF signal 152. When the current signal 1214 is not received, the RF power supply 1202 does not generate the parameter level of the state S1 of the RF signal 152 and the frequency level of the RF signal 152.

Instead, during the remaining time period during each cycle of the synchronization signal 162, in response to receiving the synchronization signal 162, the parameter controller PWRS0x generates and sends an instruction including the parameter level of the state S0 of the RF signal 152 to the DAS 1208. When the instructions are received from the parameter controller PWRS0x and the frequency controller FCx, the DAS 1208 generates a current signal 1216 based on the parameter level for the state S0 of the RF signal 152 and based on the frequency level received from the frequency controller FCx for the remaining time period of each cycle of the synchronization signal 162, and sends the current signal 1216 to the RF power supply 1202. During the remaining time period of each cycle of the synchronization signal 162 for which the current signal 1216 is received, the RF power supply 1202 generates the RF signal 152 having the parameter level of the state S0 of the RF signal 152 and the frequency level of the RF signal 152.

It should be noted that the DAS 1208 does not generate the current signal 1216 for the one or more time periods corresponding to the state S1 of the parameter of the RF signal 152 during each cycle of the synchronization signal 162. When the current signal 1216 is not received, the RF power supply 1202 does not generate the parameter level of the state S0 of the RF signal 152 and the frequency level of the RF signal 152.

Similarly, the digital signal processor DSPy receives the recipe signal 916 via the transfer cable 910 from the processor 122, and identifies from the recipe signal 916, recipe information to be sent to the parameter controller PWRS1y, recipe information to be sent to the parameter controller PWRS0y, and recipe information to be sent to the frequency controller FCy. For example, the digital signal processor DSPy identifies from the recipe signal 916 that a parameter level for the state S1 of the RF signal 918 to be generated by the RF power supply 1204 is to be sent to the parameter controller PWRS1y. The digital signal processor DSPy further identifies from the recipe signal 916 that a parameter level for the state S0 of the RF signal 916 to be generated by the RF power supply 1204 is to be sent to the parameter controller PWRS0y. Also, the digital signal processor DSPy identifies from the recipe signal 916 that a frequency level for the states S0 and S1 of the parameter of the RF signal 918 is to be sent to the frequency controller FCy.

Also, in the example, the digital signal processor DSPy identifies from the recipe signal 916 that the duty cycle for the state S1 of the parameter of the RF signal 918 and identifications of time intervals for splitting the duty cycle between a number of the time intervals during a cycle of the synchronization signal 162 are to be sent to the parameter controller PWRS1y. Continuing further with the example, the digital signal processor DSPy sends the recipe information identified within the recipe signal 918 for the parameter controller PWRS1y to the parameter controller PWRS1y. The parameter controller PWRS1y stores the recipe information received from the digital signal processor DSPy in one or more memory devices of the parameter controller PWRS1y.

Also, in the example, the digital signal processor DSPy sends the recipe information identified within the recipe signal 916 for the parameter controller PWRS0y to the parameter controller PWRS0y. The parameter controller PWRS0y stores the recipe information received from the digital signal processor DSPy in one or more memory devices of the parameter controller PWRS0y. Further, in the example, the digital signal processor DSPy sends the recipe information identified within the recipe signal 916 for the frequency controller FCy to the frequency controller FCy. The frequency controller FCy stores the recipe information received from the digital signal processor DSPy in one or more memory devices of the frequency controller FCy.

Upon receiving the synchronization signal 162 from the processor 122 via the transfer cable 910, the digital signal processor DSPy sends the synchronization signal 162 to the controllers PWRS1y, PWRS0y, and FCy. In response to receiving the synchronization signal 162, the parameter controller PWRS1y generates and sends an instruction including the parameter level of the state S1 of the RF signal 918 and the duty cycle of the state S1 to the DAS 1210 for each cycle of the synchronization signal 162. Also, in response to the reception of the synchronization signal 162, the frequency controller FCy generates and sends an instruction including the frequency level of the RF signal 918 for each cycle of the synchronization signal 162 to the DAS 1210.

When the instructions are received from the parameter controller PWRS1y and the frequency controller FCy, the DAS 1210 generates a current signal 1218 based on the parameter level for the state S1 of the RF signal 918 and based on the frequency level received from the frequency controller FCy for one or more time periods of the duty cycle of the state S1, and sends the current signal 1218 to the RF power supply 1204. The one or more time periods of the duty cycle of the state S1 of the RF signal 918 occur during the one or more time periods of each cycle of the synchronization signal 162. During the one or more time periods of the duty cycle of the state S1 of the RF signal 918 for which the current signal 1218 is received, the RF power supply 1204 generates the RF signal 918 having the parameter level of the state S1 of the RF signal 918 and the frequency level of the RF signal 918.

It should be noted that the DAS 1210 does not generate the current signal 1218 for a remaining time period during each cycle of the synchronization signal 162. The remaining time period during each cycle of the synchronization signal 162 corresponds to the state S0 of the parameter of the RF signal 918. When the current signal 1218 is not received, the RF power supply 1204 does not generate the parameter level of the state S1 of the RF signal 918 and the frequency level of the RF signal 918. Instead, during the remaining time period during each cycle of the synchronization signal 162, in response to receiving the synchronization signal 162, the parameter controller PWRS0y generates and sends an instruction including the parameter level of the state S0 of the RF signal 918 to the DAS 1210.

When the instructions are received from the parameter controller PWRS0y and the frequency controller FCy, the DAS 1210 generates a current signal 1220 based on the parameter level for the state S0 of the RF signal 918 and based on the frequency level received from the frequency controller FCy for the remaining time period of each cycle of the synchronization signal 162, and sends the current signal 1220 to the RF power supply 1204. During the remaining time period of each cycle of the synchronization signal 162 for which the current signal 1220 is received, the RF power supply 1204 generates the RF signal 918 having the parameter level of the state S0 of the RF signal 918 and the frequency level of the RF signal 918.

It should be noted that the DAS 1210 does not generate the current signal 1220 for the one or more time periods corresponding to the state S1 of the parameter of the RF signal 918 during each cycle of the synchronization signal 162. When the current signal 1220 is not received, the RF power supply 1204 does not generate the parameter level of the state S0 of the RF signal 918 and the frequency level of the RF signal 918.

Also, the digital signal processor DSPz receives the recipe signal 158 via the transfer cable 134 from the processor 122, and identifies from the recipe signal 158, recipe information to be sent to the parameter controller PWRS1z, recipe information to be sent to the parameter controller PWRS0z, and recipe information to be sent to the frequency controller FCz. For example, the digital signal processor DSPz identifies from the recipe signal 158 that a parameter level for the state S1 of the RF signal 156 to be generated by the RF power supply 1206 is to be sent to the parameter controller PWRS1z. The digital signal processor DSPZ further identifies from the recipe signal 158 that a parameter level for the state S0 of the RF signal 156 to be generated by the RF power supply 1206 is to be sent to the parameter controller PWRS0z. Also, the digital signal processor DSPz identifies from the recipe signal 158 that a frequency level for the states S0 and S1 of the parameter of the RF signal 156 is to be sent to the frequency controller FCz.

Also, in the example, the digital signal processor DSPz identifies from the recipe signal 158 that the duty cycle for the state S1 of the parameter of the RF signal 156 and identifications of time intervals for splitting the duty cycle between a number of the time intervals during a cycle of the synchronization signal 162 are to be sent to the parameter controller PWRS1z. Continuing further with the example, the digital signal processor DSPz sends the recipe information identified within the recipe signal 158 for the parameter controller PWRS1z to the parameter controller PWRS1z. The parameter controller PWRS1z stores the recipe information received from the digital signal processor DSPz in one or more memory devices of the parameter controller PWRS1z.

Also, in the example, the digital signal processor DSPz sends the recipe information identified within the recipe signal 158 for the parameter controller PWRS0z to the parameter controller PWRS0z. The parameter controller PWRS0z stores the recipe information received from the digital signal processor DSPz in one or more memory devices of the parameter controller PWRS0z. Further, in the example, the digital signal processor DSPz sends the recipe information identified within the recipe signal 158 for the frequency controller FCz to the frequency controller FCz. The frequency controller FCz stores the recipe information received from the digital signal processor DSPz in one or more memory devices of the frequency controller FCZ.

Upon receiving the synchronization signal 162 from the processor 122 via the transfer cable 134, the digital signal processor DSPz sends the synchronization signal 162 to the controllers PWRS1z, PWRS0z, and FCz. In response to receiving the synchronization signal 162, the parameter controller PWRS1z generates and sends an instruction including the parameter level of the state S1 of the RF signal 156 and the duty cycle of the state S1 to the DAS 1212 for each cycle of the synchronization signal 162. Also, in response to the reception of the synchronization signal 162, the frequency controller FCz generates and sends an instruction including the frequency level of the RF signal 156 for each cycle of the synchronization signal 162 to the DAS 1212.

When the instructions are received from the parameter controller PWRS1z and the frequency controller FCz, the DAS 1212 generates a current signal 1222 based on the parameter level for the state S1 of the RF signal 156 and based on the frequency level received from the frequency controller FCz for one or more time periods of the duty cycle of the state S1, and sends the current signal 1222 to the RF power supply 1206. The one or more time periods of the duty cycle of the state S1 of the RF signal 156 occur during the one or more time periods of each cycle of the synchronization signal 162. During the one or more time periods of the duty cycle of the state S1 of the RF signal 156 for which the current signal 1222 is received, the RF power supply 1206 generates the RF signal 156 having the parameter level of the state S1 of the RF signal 156 and the frequency level of the RF signal 156.

It should be noted that the DAS 1212 does not generate the current signal 1222 for a remaining time period during each cycle of the synchronization signal 162. The remaining time period during each cycle of the synchronization signal 162 corresponds to the state S0 of the parameter of the RF signal 156. When the current signal 1222 is not received, the RF power supply 1206 does not generate the parameter level of the state S1 of the RF signal 156 and the frequency level of the RF signal 156. Instead, during the remaining time period during each cycle of the synchronization signal 162, in response to receiving the synchronization signal 162, the parameter controller PWRS0z generates and sends an instruction including the parameter level of the state S0 of the RF signal 156 to the DAS 1212.

When the instructions are received from the parameter controller PWRS0z and the frequency controller FCy, the DAS 1212 generates a current signal 1224 based on the parameter level for the state S0 of the RF signal 156 and based on the frequency level received from the frequency controller FCz for the remaining time period of each cycle of the synchronization signal 162, and sends the current signal 1224 to the RF power supply 1206. During the remaining time period of each cycle of the synchronization signal 162 for which the current signal 1224 is received, the RF power supply 1206 generates the RF signal 156 having the parameter level of the state S0 of the RF signal 156 and the frequency level of the RF signal 156.

It should be noted that the DAS 1212 does not generate the current signal 1224 for the one or more time periods corresponding to the state S1 of the parameter of the RF signal 156 during each cycle of the synchronization signal 162. When the current signal 1224 is not received, the RF power supply 1206 does not generate the parameter level of the state S0 of the RF signal 156 and the frequency level of the RF signal 156.

It should be noted that in case the parameter level of any of the RF signals 152, 918, and 156 during the state S0 of the parameter of the RF signal is zero, the current signals 1216, 1220, and 1224 are not generated. When the current signal 1216 is not generated during the state S0 of the parameter of the RF signal 152, the RF power supply 1202 does not generate the RF signal 152. Similarly, when the current signal 1220 is not generated during the state S0 of the parameter of the RF signal 918, the RF power supply 1204 does not generate the RF signal 918. Also, when the current signal 1224 is not generated during the state S0 of the parameter of the RF signal 156, the RF power supply 1206 does not generate the RF signal 156.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods, described herein, are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including a capacitively coupled plasma (CCP) reactor, a plasma chamber including an ICP reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, a controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method for pulsing radio frequency (RF) coils, comprising:
   supplying, from a first RF generator, a first RF signal to a first impedance matching circuit coupled to a first RF coil;

supplying, from a second RF generator, a second RF signal to a second impedance matching circuit coupled to a second RF coil;

pulsing, by the first RF generator, the first RF signal between a first parameter level and a second parameter level; and pulsing, by the second RF generator, the second RF signal between a third parameter level and a fourth parameter level in reverse synchronization with said pulsing of the first RF signal, wherein the first parameter level is a peak-to-peak amplitude or a zero-to-peak amplitude of the first RF signal, the second parameter level is a peak-to-peak amplitude or a zero-to-peak amplitude of the first RF signal, the third parameter level is a peak-to-peak amplitude or a zero-to-peak amplitude of the second RF signal, and the fourth parameter level is a peak-to-peak amplitude or a zero-to-peak amplitude of the second RF signal.

2. The method of claim 1, wherein said pulsing the second RF signal in reverse synchronization with said pulsing of the first RF signal comprises:

transitioning the second RF signal from the third parameter level to the fourth parameter level during a time period in which the first RF signal transitions from the first parameter level to the second parameter level; and transitioning the second RF signal from the fourth parameter level to the third parameter level during a time period in which the first RF signal transitions from the second parameter level to the first parameter level, wherein the first parameter level is different from the third parameter level, and the second parameter level is different from the fourth parameter level.

3. The method of claim 1, further comprising:

maintaining, by the second RF generator, the second RF signal at the third parameter level during a time period in which the first RF signal is maintained at the first parameter level; and maintaining, by the second RF generator, the second RF signal at the fourth parameter level during a time period in which the first RF signal is maintained at the second parameter level.

4. The method of claim 1, wherein the first RF coil and the second RF coil are located above a dielectric window of the plasma chamber.

5. The method of claim 1, wherein the first parameter level includes one or more values and the second parameter level includes one or more parameter values, wherein the one or more values of the first parameter level are exclusive of the one or more values of the second parameter level.

6. The method of claim 1, wherein the third parameter level includes one or more values and the fourth parameter level includes one or more values, wherein the one or more values of the third parameter level are exclusive of the one or more values of the fourth parameter level.

7. The method of claim 1, wherein the first RF signal has a substantially same frequency as the second RF signal.

8. The method of claim 1, wherein each of the first RF signal and the second RF signal has a frequency ranging between 10 kilohertz (kHz) and 100 kHz.

9. The method of claim 1, wherein the first parameter level of the first RF signal has a duty cycle, wherein the second parameter level has a duty cycle that is equal to a difference between 100 percent and the duty cycle of the first parameter level of the first RF signal, wherein the fourth parameter level has a duty cycle that is equal to the difference.

10. The method of claim 1, wherein the first parameter level and the second parameter level occur during a cycle of a synchronization signal, wherein the third parameter level and the fourth parameter level occur during the cycle.

11. The method of claim 1, wherein said pulsing the first RF signal includes:

transitioning the first RF signal from the first parameter level to the second parameter level during a cycle of a synchronization signal;

transitioning the first RF signal from the second parameter level to the first parameter level during the cycle of the synchronization signal, wherein said pulsing the second RF signal includes:

transitioning the second RF signal from the third parameter level to the fourth parameter level during the cycle of the synchronization signal;

transitioning the second RF signal from the fourth parameter level to the third parameter level during the cycle of the synchronization signal.

12. The method of claim 1, further comprising:

supplying, from a third RF generator, a third RF signal to a third RF coil of the plasma chamber via a third impedance matching circuit;

pulsing, by the third RF generator, the third RF signal between a fifth parameter level and a sixth parameter level, wherein the third RF signal is pulsed in reverse synchronization with the first RF signal and the second RF signal.

13. The method of claim 1, wherein the method is performed during a semiconductor wafer processing operation to minimize tilting of features.

14. A controller for pulsing radio frequency (RF) coils, comprising:

a processor configured to:

control a first RF generator to supply a first RF signal to a first impedance matching circuit, wherein the first impedance circuit is configured to be coupled to a first RF coil; and control a second RF generator to supply a second RF signal to a second impedance matching circuit, wherein the second impedance circuit is configured to be coupled to a second RF coil, wherein the first RF generator is controlled to pulse the first RF signal between a first parameter level and a second parameter level, wherein the second RF generator is controlled to pulse the second RF signal between a third parameter level and a fourth parameter level in reverse synchronization with the pulsing of the first RF signal, wherein the first parameter level is a peak-to-peak amplitude or a zero-to-peak amplitude of the first RF signal, the second parameter level is a peak-to-peak amplitude or a zero-to-peak amplitude of the first RF signal, the third parameter level is a peak-to-peak amplitude or a zero-to-peak amplitude of the second RF signal, and the fourth parameter level is a peak-to-peak amplitude or a zero-to-peak amplitude of the second RF signal; and a memory device coupled to the processor.

15. The controller of claim 14, wherein to pulse the second RF signal in reverse synchronization with the pulsing of the first RF signal, the processor is configured to:

control the second RF generator to transition the second RF signal from the third parameter level to the fourth parameter level during a time period in which the first RF signal transitions from the first parameter level to the second parameter level; and control the second RF generator to transition the second RF signal from the fourth parameter level to the third parameter level during a time period in which the first RF signal transitions from the second parameter level to the first parameter level, wherein the first parameter level is different from the third parameter level, and the second parameter level is different from the fourth parameter level.

16. The controller of claim 14, wherein the processor is configured to:

control the second RF generator to maintain the second RF signal at the third parameter level during a time period in which the first RF signal is maintained at the first parameter level; and control the second RF generator to maintain the second RF signal at the fourth parameter level during a time period in which the first RF signal is maintained at the second parameter level.

17. The controller of claim 14, wherein the first RF coil and the second RF coil are located above a dielectric window of the plasma chamber.

18. The controller of claim 14, wherein the first parameter level includes one or more values and the second parameter level includes one or more values, wherein the one or more values of the first parameter level are exclusive of the one or more values of the second parameter level.

19. The controller of claim 14, wherein the third parameter level includes one or more values and the fourth parameter level includes one or more values, wherein the one or more values of the third parameter level are exclusive of the one or more values of the fourth parameter level.

20. The controller of claim 14, wherein the first RF signal has a substantially same frequency as the second RF signal, wherein each of the first RF signal and the second RF signal has a frequency ranging between 10 kilohertz (kHz) and 100 kHz.

* * * * *